(12) United States Patent
DeSimone et al.

(10) Patent No.: US 8,268,446 B2
(45) Date of Patent: Sep. 18, 2012

(54) PHOTOCURABLE PERFLUOROPOLYETHERS FOR USE AS NOVEL MATERIALS IN MICROFLUIDIC DEVICES

(75) Inventors: Joseph M. DeSimone, Chapel Hill, NC (US); Jason P. Rolland, Durham, NC (US); Stephen R. Quake, Stanford, CA (US); Derek A. Schorzman, Chapel Hill, NC (US); Jason Yarbrough, Spartanburg, SC (US); Michael Van Dam, Glendale, CA (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 1469 days.

(21) Appl. No.: 10/572,764

(22) PCT Filed: Sep. 23, 2004

(86) PCT No.: PCT/US2004/031274
§ 371 (c)(1),
(2), (4) Date: May 16, 2007

(87) PCT Pub. No.: WO2005/030822
PCT Pub. Date: Apr. 7, 2005

(65) Prior Publication Data
US 2007/0254278 A1      Nov. 1, 2007

Related U.S. Application Data

(60) Provisional application No. 60/505,384, filed on Sep. 23, 2003, provisional application No. 60/524,788, filed on Nov. 21, 2003.

(51) Int. Cl.
*C28J 5/20* (2006.01)
*H01M 4/88* (2006.01)
*H01M 8/10* (2006.01)
*B05D 5/12* (2006.01)

(52) U.S. Cl. .......... 428/421; 210/600; 427/2.11; 427/8; 427/508; 427/240; 427/271; 427/272; 427/282; 427/331; 427/384; 427/385.5; 427/333; 427/407.1; 430/270.1; 977/840; 977/904; 977/888; 977/702

(58) Field of Classification Search .......... 427/2.11, 427/8, 508, 240, 271, 272, 282, 331, 384; 427/385.5, 407.1, 333; 264/154, 293, 494; 252/600; 430/270.1; 977/840, 904, 888, 977/890, 892, 893, 902, 702, 708; 428/421; 210/600
See application file for complete search history.

(56) References Cited

U.S. PATENT DOCUMENTS

| | | |
|---|---|---|
| 3,810,874 A | 5/1974 | Mitsch et al. |
| 4,352,874 A | 10/1982 | Land et al. |
| 4,353,977 A | 10/1982 | Gerber et al. |
| 4,356,257 A | 10/1982 | Gerber |
| 4,359,526 A | 11/1982 | Walworth |
| 4,512,848 A | 4/1985 | Deckman et al. |
| 4,567,073 A | 1/1986 | Larson et al. ............ 428/40 |
| 4,614,667 A | 9/1986 | Larson et al. |
| 4,663,274 A | 5/1987 | Slafer et al. |
| 4,681,925 A | 7/1987 | Strepparola et al. |
| 4,818,801 A | 4/1989 | Rice et al. |
| 4,830,910 A | 5/1989 | Larson |
| 5,041,359 A | 8/1991 | Kooi |
| 5,175,030 A | 12/1992 | Lu et al. |
| 5,189,135 A | 2/1993 | Cozzi et al. |
| 5,259,926 A | 11/1993 | Kuwabara et al. |
| 5,279,689 A | 1/1994 | Shvartsman |
| 5,368,789 A | 11/1994 | Kamitakahara et al. |
| 5,425,848 A | 6/1995 | Haisma et al. |
| 5,512,131 A | 4/1996 | Kumar et al. |
| 5,512,374 A | 4/1996 | Wallace et al. |
| 5,593,130 A | 1/1997 | Hansson et al. ............ 251/61.1 |
| 5,630,902 A | 5/1997 | Galarneau et al. |
| 5,753,150 A | 5/1998 | Martin et al. |
| 5,772,905 A | 6/1998 | Chou |
| 5,817,242 A | 10/1998 | Biebuyck et al. |
| 5,965,631 A | 10/1999 | Nicolson et al. |
| 5,994,133 A | 11/1999 | Meijs et al. |
| 6,015,609 A | 1/2000 | Chaouk ............ 428/308.4 |
| 6,027,595 A | 2/2000 | Suleski |
| 6,027,630 A | 2/2000 | Cohen |

(Continued)

FOREIGN PATENT DOCUMENTS

EP      0393263 A1      10/1990
(Continued)

OTHER PUBLICATIONS

Rolland et al., "Solvent-Resistant Photocurable 'Liquid Teflon' for Microfluidic Device Fabrication," J. Am. Chem. Soc. 2004, 126, 2322-2323; published on web Feb. 6, 2004.*
International Preliminary Examination Report for PCT/US2005/004421, Jun. 25, 2008, 3 pages.*
Bongiovanni, R., et al., "Fluorinated Networks Through Photopolymerisation Processes: Synthesis, Characterization and Properties," *J. Fluor. Chem.*, 2004, pp. 345-351, vol. 125, Elsevier.
Bongiovanni, R., et al., "Perfluoropolyether Structures as Surface Modifying Agents of UV-Curable Systems," *Macromol. Chem. Phys.*, 1998, pp. 1099-1105, vol. 199.
Choi, W.M. and O.O. Park, "A Soft-Imprint Technique for Direct Fabrication of Submicron Scale Patterns Using a Surface-Modified PDMS Mold," *Microelect. Eng.*, 2003, pp. 131-136, vol. 70, Elsevier.
Chou, S.Y., et al., "Imprint of Sub-25 nm Vias and Trenches in Polymers," *Appl. Phys. Lett.*, 1995, pp. 3114-3116, vol. 67(21).

(Continued)

*Primary Examiner* — William Phillip Fletcher, III
(74) *Attorney, Agent, or Firm* — Alston & Bird LLP

(57) ABSTRACT

The use of a photocurable perfluoropolyether (PFPE) material for fabricating a solvent-resistant PFPE-based microfluidic device, methods of flowing a material and performing a chemical reaction in a solvent-resistant PFPE-based microfluidic device, and the solvent-resistant PFPE-based microfluidic devices themselves are described. In an embodiment, a method is described for preparing a patterned layer of a photocured perfluoropolyether, the method comprising: (a) providing a substrate, wherein the substrate comprises a patterned surface; (b) contacting a perfluoropolvether precursor with the patterned surface of the substrate; and (c) photocuring the perfluoropolyether precursor to form a patterned layer of a photocured perfluoropolyether.

170 Claims, 15 Drawing Sheets

U.S. PATENT DOCUMENTS

| | | |
|---|---|---|
| 6,183,829 B1 | 2/2001 | Daecher ............... 428/64.1 |
| 6,204,296 B1 | 3/2001 | Weers et al. |
| 6,207,758 B1 | 3/2001 | Brinati et al. |
| 6,228,318 B1 | 5/2001 | Nakamae et al. |
| 6,247,986 B1 | 6/2001 | Chiu et al. |
| 6,280,808 B1 | 8/2001 | Fields ............... 428/64.1 |
| 6,284,072 B1 | 9/2001 | Ryan et al. |
| 6,294,450 B1 | 9/2001 | Chen et al. |
| 6,300,042 B1 | 10/2001 | Mancini et al. |
| 6,306,563 B1 | 10/2001 | Xu et al. |
| 6,334,960 B1 | 1/2002 | Willson et al. |
| 6,335,224 B1 * | 1/2002 | Peterson et al. ........... 438/114 |
| 6,355,198 B1 | 3/2002 | Kim et al. |
| 6,375,870 B1 | 4/2002 | Visovsky et al. |
| 6,403,539 B1 | 6/2002 | Marchionni et al. ........ 508/568 |
| 6,408,878 B2 | 6/2002 | Unger ............... 137/597 |
| 6,422,528 B1 | 7/2002 | Domeier et al. |
| 6,451,403 B1 | 9/2002 | Daecher ............... 428/64.1 |
| 6,508,988 B1 | 1/2003 | Van Dam ............... 422/102 |
| 6,517,995 B1 | 2/2003 | Jacobson et al. |
| 6,518,189 B1 | 2/2003 | Chou |
| 6,555,221 B1 | 4/2003 | Komiyama et al. |
| 6,607,683 B1 | 8/2003 | Harrington |
| 6,645,432 B1 | 11/2003 | Anderson et al. |
| 6,649,715 B1 | 11/2003 | Smith et al. |
| 6,653,030 B2 | 11/2003 | Mei et al. |
| 6,656,308 B2 | 12/2003 | Hougham et al. |
| 6,656,398 B2 | 12/2003 | Birch et al. |
| 6,660,192 B1 | 12/2003 | Kim et al. |
| 6,663,820 B2 | 12/2003 | Arias et al. |
| 6,686,184 B1 | 2/2004 | Anderson ............... 435/174 |
| 6,689,900 B2 | 2/2004 | Wang et al. |
| 6,696,220 B2 | 2/2004 | Bailey et al. |
| 6,699,347 B2 | 3/2004 | Lehrter et al. |
| 6,705,357 B2 | 3/2004 | Jeon ............... 141/9 |
| 6,719,868 B1 | 4/2004 | Schueller ............... 156/272.6 |
| 6,737,489 B2 | 5/2004 | Linert et al. |
| 6,752,942 B2 | 6/2004 | Kim et al. |
| 6,753,131 B1 | 6/2004 | Rogers et al. |
| 6,755,984 B2 | 6/2004 | Lee et al. |
| 6,759,182 B2 | 7/2004 | Ikeda et al. |
| 6,767,706 B2 | 7/2004 | Quake ............... 435/6 |
| 6,770,721 B1 | 8/2004 | Kim |
| 6,783,717 B2 | 8/2004 | Hougham et al. |
| 6,793,753 B2 | 9/2004 | Unger ............... 156/155 |
| 6,808,646 B1 | 10/2004 | Jeans |
| 6,809,356 B2 | 10/2004 | Chou |
| 6,828,244 B2 | 12/2004 | Chou |
| 6,829,050 B2 | 12/2004 | Ikeda et al. |
| 6,841,079 B2 | 1/2005 | Dunbar et al. ............... 216/2 |
| 6,844,623 B1 | 1/2005 | Peterson ............... 257/723 |
| 6,849,558 B2 | 2/2005 | Schaper |
| 6,860,956 B2 | 3/2005 | Bao et al. |
| 6,869,557 B1 | 3/2005 | Wago et al. |
| 6,900,881 B2 | 5/2005 | Sreenivasan et al. |
| 6,923,930 B2 | 8/2005 | Ling et al. |
| 6,929,030 B2 | 8/2005 | Unger ............... 137/883 |
| 6,929,899 B2 | 8/2005 | Pottebaum et al. |
| 6,932,934 B2 | 8/2005 | Choi et al. |
| 6,936,181 B2 | 8/2005 | Bulthaup et al. |
| 6,936,194 B2 | 8/2005 | Watts |
| 6,953,653 B2 | 10/2005 | Smith et al. |
| 6,956,283 B1 | 10/2005 | Peterson ............... 438/114 |
| 6,964,793 B2 | 11/2005 | Willson et al. |
| 6,976,424 B2 | 12/2005 | Bruno et al. |
| 7,040,338 B2 | 5/2006 | Unger ............... 251/129.01 |
| 7,070,406 B2 | 7/2006 | Jeans |
| 7,117,790 B2 | 10/2006 | Kendale et al. |
| 7,294,294 B1 | 11/2007 | Wago et al. |
| 2002/0160139 A1 | 10/2002 | Huang et al. |
| 2003/0006527 A1 | 1/2003 | Rabolt et al. |
| 2003/0062334 A1 | 4/2003 | Lee et al. |
| 2003/0071016 A1 | 4/2003 | Shih et al. |
| 2003/0139521 A1 | 7/2003 | Linert et al. |
| 2003/0205552 A1 | 11/2003 | Hansford et al. |
| 2004/0028804 A1 | 2/2004 | Anderson et al. |
| 2004/0046271 A1 | 3/2004 | Watts |
| 2004/0053009 A1 | 3/2004 | Ozin et al. |
| 2004/0065252 A1 | 4/2004 | Sreenivasan et al. |
| 2004/0084402 A1 | 5/2004 | Ashmead ............... 204/601 |
| 2004/0110856 A1 | 6/2004 | Young et al. |
| 2004/0137734 A1 | 7/2004 | Chou et al. |
| 2004/0202865 A1 | 10/2004 | Homola et al. |
| 2004/0217085 A1 | 11/2004 | Jeans |
| 2004/0219246 A1 | 11/2004 | Jeans |
| 2005/0038180 A1 | 2/2005 | Jeans |
| 2005/0048581 A1 | 3/2005 | Chiu ............... 435/7.2 |
| 2005/0061773 A1 | 3/2005 | Choi et al. |
| 2005/0120902 A1 | 6/2005 | Adams et al. |
| 2005/0255003 A1 | 11/2005 | Summersgill et al. |
| 2005/0265675 A1 | 12/2005 | Welker et al. |
| 2005/0266582 A1 | 12/2005 | Modlin ............... 209/552 |
| 2006/0009805 A1 | 1/2006 | Jensen ............... 607/54 |
| 2006/0021533 A1 | 2/2006 | Jeans ............... 101/327 |
| 2006/0022131 A1 | 2/2006 | Tojo ............... 250/288 |
| 2006/0070653 A1 | 4/2006 | Elrod et al. |
| 2006/0077221 A1 | 4/2006 | Vaideeswaran ............... 347/20 |
| 2006/0083971 A1 | 4/2006 | DeSimone et al. |
| 2006/0188598 A1 | 8/2006 | Jeans |
| 2007/0012891 A1 | 1/2007 | Maltezos |
| 2007/0275193 A1 | 11/2007 | DeSimone et al. |
| 2008/0038398 A1 | 2/2008 | Wago et al. |
| 2009/0165320 A1 | 7/2009 | DeSimone et al. |

FOREIGN PATENT DOCUMENTS

| | | |
|---|---|---|
| EP | 1 551 066 A1 | 7/2005 |
| WO | WO91/16966 | 11/1991 |
| WO | WO 96/017266 | 6/1996 |
| WO | WO 96/31548 | 10/1996 |
| WO | WO 96/31791 | 10/1996 |
| WO | WO98/07069 | 2/1998 |
| WO | WO 02/14078 A2 | 2/2002 |
| WO | WO02/29397 | 4/2002 |
| WO | WO02/053290 | 7/2002 |
| WO | WO02/093125 | 11/2002 |
| WO | WO 03/005124 A1 | 1/2003 |
| WO | WO03/011443 | 2/2003 |
| WO | WO03/015890 | 2/2003 |
| WO | WO 03/031096 A2 | 4/2003 |
| WO | WO 03/072625 A1 | 9/2003 |
| WO | WO03/101888 | 12/2003 |
| WO | WO 2004/002627 | 1/2004 |
| WO | WO 2004/022233 | 3/2004 |
| WO | WO2005/028108 | 3/2004 |
| WO | WO2004/074818 | 9/2004 |
| WO | WO2004/079364 | 9/2004 |
| WO | WO2004/084402 | 9/2004 |
| WO | WO 2005/030822 A3 * | 4/2005 |
| WO | WO2005/046997 | 5/2005 |
| WO | WO2005/060748 | 7/2005 |
| WO | WO2006/071470 | 7/2006 |
| WO | WO 2006/083311 A2 | 8/2006 |

OTHER PUBLICATIONS

Colburn, M., "Capillary Fill Time & Meniscus Shape: An Asymmetric, Nonequal Contact Angle, Coplanar Cavity Study," *ChE 385 Project Report*, Available Online at Willson.cm.utexas.edu-...-Surface_Phenomena-Spring1999Asymetric_Noon_equal_contact_angle_capillary_study, Dec. 3, 1998.

Haatainen, T and J. Ahopelto, "Step & Stamp Imprint Lithography: A Versatile Method for Nanoimprinting," presented at the NNT Conference, Dec. 11-13, 2002 at San-Francisco, CA.

Haatainen, T., and J. Ahopelto, "Pattern Transfer Using Step & Stamp Imprint Lithography," *Physica. Scripta.*, 2003, pp. 357-360, vol. 67.

Haatainen, T., et. al., "Step & Stamp Imprint Lithography Using a Commercial Flip Chip Bonder," *Proceeding of SPIE's 25th Annual International Symposium of Microlithography, Emerging Lithographic Technologies IV* at Santa Clara, CA, 2000.

Haisma, J., et al., "Mold-Assisted Nanolithography: A Process for Reliable Pattern Replication," *J. Vac. Sci. Technol.*, 1996, pp. 4124-4128, vol. B14(6).

Hulteen, J.C. and C.R. Martin, "A General Template-Based Method for the Preparation of Nanomaterials," *J. Mater. Chem.*, 1997, pp. 1075-1087, vol. 7(7).

Jackman, R., et al., "Fabricating Large Arrays of Microwells with Arbitrary Dimensions and Filling Them Using Discontinuous Dewetting," *Analytical Chemistry*, 1998, pp. 2280-2287, vol. 70(11).

Krauss, P., et al., Fabrication of Nanodevices Using Sub-25 nm Imprint Lithography, *Presented at NanoStructure Laboratory, Department of Electrical Engineering, University of Minnesota*, Minneapolis, MN, pp. 194-195.

Marzolin, C., et al., "Fabrication of Glass Microstructures by Micro-Molding of Sol-Gel Precursors," *Adv.Mater.*, 1998, pp. 571-574, vol. 10(8).

Suh, K.Y., et al., "Capillary Force Lithography," *Adv. Mater.*, 2001, pp. 1386-1389, vol. 13(18).

Suh, K.Y., and H.H. Lee, "Capillary Force Lithography: Large-Area Patterning, Self-Organization, and Anisotropic Dewetting," *Adv. Funct. Mater.*, 2002, pp. 405-413, vol. 12(6+7).

Tan, H., et al., "Roller Nanoimprint Lithography," *J. Vac. Sci. Technol.*, 1998, pp. 3926-3928, vol. B16(6).

Trombetta, T., et al., "Novel Branched Fluorinated Oligourethane Cationomers for Low Surface Tension Treatments," *Progr. Colloid. Polym. Sci.*, 2004, pp. 47-53, vol. 124.

Turri, S., et al., "Novel Glass Fiber-Reinforced Composites Having a UV and Peroxy Curable Fluoropolymer Matrix," *Macromol. Mater. Eng.*, 2003, pp. 708-716, vol. 288(9).

Wood, C.D., et al., "New Fluoropolymer Materials," *J. Fluor. Chem.*, 2004, pp. 1671-1676, vol. 125, Elsevier.

Xia, Y., et al., "Complex Optical Surfaces by Replica Molding Against Elastomeric Masters," *Sci. New Series*, 1996, pp. 347-349, vol. 274(5273).

Yin, Y. and Y. Xia, "Self-Assembly of Monodispersed Spherical Colloids into Complex Aggregates with Well-Defined Sizes, Shapes, and Structures," *Adv. Mater.*, 2001, pp. 267-271, vol. 13(4).

Notification of Transmittal of International Preliminary Report on Patentability corresponding to the International Application No. PCT/US04/31274, dated Feb. 12, 2007.

Priola, A., et al., "UV-Curable Systems Containing Perfluoropolyether Structures: Synthesis and Characterisation," *Macromol. Chem. Phys.*, 1997, pp. 1893-1907, vol. 198(6).

Notification of Transmittal of the International Search Report and the Written Opinion of the International Searching Authority, or the Declaration corresponding to the International Application No. PCT/US04/31274, dated Sep. 28, 2006.

Quake et al. *From micro- to nanofabrication with soft materials. Science*, vol. 290, (2000), pp. 1536-1540.

Becker et al. *Polymer microfabrication methods for microfluidic analytical applications. Electrophoresis*, vol. 21, (2000), pp. 12-26.

Unger et al. *Monolithic microfabricated vavles and pumps by multilayer soft lithography. Science*, vol. 288, (2000), pp. 113-116.

McDonald et al. *Poly(dimethylsoloxane) as a material for fabricating microfluidic devices. Accounts of Chemical Research*, vol. 35, No. 7, (2002), pp. 491-499.

Hansen et al. *Microfluidics in structural biology: smaller, faster . . . better. Current Opinion in Structural Biology*, vol. 13, (2003), pp. 538-544.

Xia et al. *Soft lithography. Angewandte Chemie International Edition*, vol. 37, (1998), pp. 550-575.

Dittrich et al. *Lab-on-a-chip: microfluidics in drug discovery. Nature*, vol. 5, (2006), pp. 210-218.

Duffy et al. *Rapid prototyping of microfluidic systems in poly(dimethylsiloxane). Analytical Chemistry*, vol. 70, (1998), pp. 4974-4984.

Thorsen et al. *Microfuidic large-scale integration. Science*, vol. 298, (2002), pp. 580-584.

Lee et al. *Solvent compatibility of poly(dimethylsiloxane)-based microfluidic devices. Analytical Chemistry*, vol. 75, No. 23, (2003), pp. 6544-6554.

Gu et al. *Computerized microfluidic cell culture using elastomenc channels and Braille displays. Proceedings of the National Academy of Sciences of USA*, vol. 101, No. 45, (2004), pp. 15861-15866.

Rolland et al. *Solvent-resistant photocurable "liquid teflon" for microfluidic device fabrication. Journal of American Chemical Society*, vol. 126, No. 8, (2004), pp. 2322-2323.

* cited by examiner

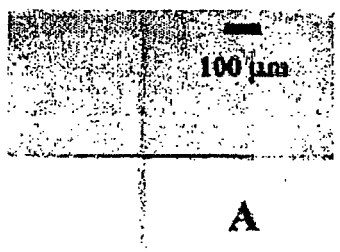
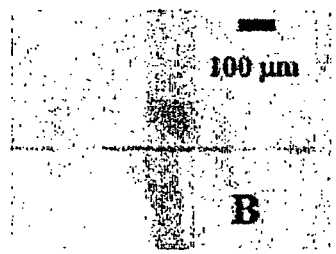
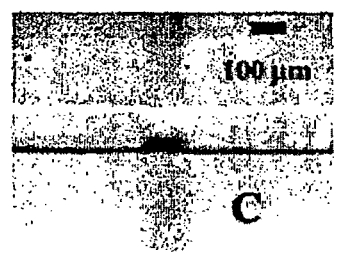
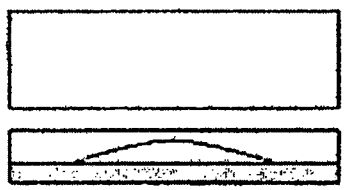
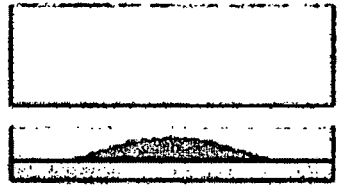
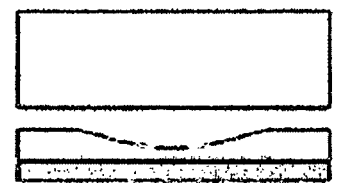
FIG. 15A  FIG. 15B  FIG. 15C PHOTOCURABLE PERFLUOROPOLYETHERS FOR USE AS NOVEL MATERIALS IN MICROFLUIDIC DEVICES

RELATED APPLICATIONS

This application claims the benefit of U.S. Provisional Patent Application Ser. No. 60/505,384, filed Sep. 23, 2003, and U.S. Provisional Patent Application Ser. No. 60/524,788, filed Nov. 21, 2003; the disclosure of each of which is incorporated herein by reference in their entireties.

GOVERNMENT INTEREST

A portion of this invention was made with U.S. Government support from the Office of Naval Research Grant No. N00014-02-1-0185. The U.S. Government has certain rights to that portion of the invention.

TECHNICAL FIELD

The use of a photocurable perfluoropolyether (PFPE) material for fabricating a solvent-resistant PFPE-based microfluidic device, methods of flowing a material and performing a chemical reaction in a solvent-resistant PFPE-based microfluidic device, and the solvent-resistant PFPE-based microfluidic devices themselves.

ABBREVIATIONS

| | |
|---|---|
| aL = | attoliters |
| °C. = | degrees Celsius |
| cm = | centimeters |
| cSt = | centistokes |
| DBTDA = | dibutyltin diacetate |
| DMA = | dimethacrylate |
| DMPA = | 2,2-dimethoxy-2-phenylacetophenone |
| DMTA = | dynamic mechanical thermal analysis |
| EIM = | 2-isocyanatoethyl methacrylate |
| fL = | femtoliters |
| Freon 113 = | 1,1,2-trichlorotrifluoroethane |
| g = | grams |
| h = | hours |
| Hz = | hertz |
| kHz = | kilohertz |
| kPa = | kilopascals |
| MHz = | megahertz |
| min = | minutes |
| mL = | milliliters |
| mm = | millimeters |
| mmol = | millimoles |
| mN = | milli-Newton |
| m.p. = | melting point |
| nL = | nanoliters |
| nm = | nanometers |
| PDMS = | polydimethylsiloxane |
| PFPE = | perfluoropolyether |
| pL = | picoliters |
| psi = | pounds per square inch |
| s = | seconds |
| Tg = | glass transition temperature |
| μL = | microliters |
| μm = | micrometers |
| UV = | ultraviolet |
| W = | watts |
| ZDOL = | poly(tetrafluoroethylene oxide-co-difluoromethylene oxide)α, ω diol |

BACKGROUND

Microfluidic devices developed in the early 1990s were fabricated from hard materials, such as silicon and glass, using photolithography and etching techniques. See Ouellette. J., *The Industrial Physicist* 2003, August/September, 14-17; Scherer, A., et al., *Science* 2000, 290, 1536-1539. Photolithography and etching techniques, however, are costly and labor intensive, require clean-room conditions, and pose several disadvantages from a materials standpoint. For these reasons, soft materials have emerged as alternative materials for microfluidic device fabrication. The use of soft materials has made possible the manufacture and actuation of devices containing valves, pumps, and mixers. See, e.g., Ouellette. J., *The Industrial Physicist* 2003, August/September, 14-17; Scherer, A., et al., *Science* 2000, 290, 1536-1539; Unger, M. A., et al., *Science* 2000, 288, 113-116; McDonald, J. C., et al., *Acc. Chem. Res.* 2002, 35, 491-499; and Thorsen, T., et al., *Science* 2002, 298, 580-584. For example, one such microfluidic device allows for control over flow direction without the use of mechanical valves. See Zhao. B., et al., *Science* 2001, 291, 1023-1026.

The increasing complexity of microfluidic devices has created a demand to use such devices in a rapidly growing number of applications. To this end, the use of soft materials has allowed microfluidics to develop into a useful technology that has found application in genome mapping, rapid separations, sensors, nanoscale reactions, ink-jet printing, drug delivery, Lab-on-a-Chip, in vitro diagnostics, injection nozzles, biological studies, and drug screening. See, e.g., Ouellette. J., *The Industrial Physicist* 2003, August/September, 14-17; Scherer, A., et al., *Science* 2000, 290, 1536-1539; Unger, M. A., et al., *Science* 2000, 288, 113-116; McDonald. J. C., et al., *Acc. Chem. Res.* 2002, 35, 491-499; Thorsen, T., et al., *Science* 2002, 298, 580-584; and Liu, J., et al., *Anal Chem.* 2003, 75, 4718-4723.

Poly(dimethylsiloxane) (PDMS) is the soft material of choice for many microfluidic device applications. See Scherer, A., et al., *Science* 2000, 290, 1536-1539; Unger, M. A., et al., *Science* 2000, 288, 113-116; McDonald, J. C., et al., *Acc. Chem. Res.* 2002, 35, 491-499; Thorsen, T., et al., *Science* 2002, 298, 580-584; and Liu, J., et al., *Anal. Chem.* 2003, 75, 4718-4723. A PDMS material offers numerous attractive properties in microfluidic applications. Upon cross-linking, PDMS becomes an elastomeric material with a low Young's modulus, e.g., approximately 750 kPa. See Unger, M. A., et al., *Science* 2000, 288, 113-116. This property allows PDMS to conform to surfaces and to form reversible seals. Further, PDMS has a low surface energy, e.g., approximately 20 erg/$cm^2$, which can facilitate its release from molds after patterning. See Scherer, A., et al., *Science* 2000, 290, 1536-1539; McDonald. J. C., et al., *Acc. Chem. Res.* 2002, 35, 491-499.

Another important feature of PDMS is its outstanding gas permeability. This property allows gas bubbles within the channels of a microfluidic device to permeate out of the device. This property also is useful in sustaining cells and microorganisms inside the features of the microfluidic device. The nontoxic nature of silicones, such as PDMS, also is beneficial in this respect and allows for opportunities in the realm of medical implants. McDonald. J. C., et al., *Acc. Chem. Res.* 2002, 35, 491-499.

Many current PDMS microfluidic devices are based on Sylgard® 184 (Dow Corning, Midland, Mich., United States of America). Sylgard® 184 is cured thermally through a platinum-catalyzed hydrosilation reaction. Complete curing of Sylgard® 184 can take as long as five hours. The synthesis of a photocurable PDMS material, however, with mechanical properties similar to that of Sylgard® 184 for use in soft lithography recently has been reported. See Choi, K. M., et al., *J. Am. Chem. Soc.* 2003, 125, 4060-4061.

Despite the aforementioned advantages, PDMS suffers from a drawback in microfluidic applications in that it swells in most organic solvents. Thus, PDMS-based microfluidic devices have a limited compatibility with various organic solvents. See Lee. J. N., et al., *Anal. Chem.* 2003, 75, 6544-6554. Among those organic solvents that swell PDMS are hexanes, ethyl ether, toluene, dichloromethane, acetone, and acetonitrile. See Lee. J. N., et al., *Anal. Chem.* 2003, 75, 6544-6554. The swelling of a PDMS microfluidic device by organic solvents can disrupt its micron-scale features, e.g., a channel or plurality of channels, and can restrict or completely shut off the flow of organic solvents through the channels. Thus, microfluidic applications with a PDMS-based device are limited to the use of fluids, such as water, that do not swell PDMS. As a result, those applications that require the use of organic solvents likely will need to use microfluidic systems fabricated from hard materials, such as glass and silicon. See Lee, J. N., et al., *Anal. Chem.* 2003, 75, 6544-6554. This approach, however, is limited by the disadvantages of fabricating microfluidic devices from hard materials.

Moreover, PDMS-based devices and materials are notorious for not being adequately inert enough to allow them to be used even in aqueous-based chemistries. For example, PDMS is susceptible to reaction with weak and strong acids and bases. PDMS-based devices also are notorious for containing extractables, in particular extractable oligomers and cyclic siloxanes, especially after exposure to acids and bases. Because PDMS is easily swollen by organics, hydrophobic materials, even those hydrophobic. materials that are slightly soluble in water, can partition into PDMS-based materials used to construct PDMS-based microfluidic devices.

Thus, an elastomeric material that exhibits the attractive mechanical properties of PDMS combined with a resistance to swelling in common organic solvents would extend the use of microfluidic devices to a variety of new chemical applications that are inaccessible by current PDMS-based devices. Accordingly, the, approach demonstrated by the presently disclosed subject matter uses an elastomeric material, more particularly a photocurable perfluoropolyether (PFPE) material, which is resistant to swelling in common organic solvents to fabricate a microfluidic device.

Photocurable PFPE materials represent a unique class of fluoropolymers that are liquids at room temperature, exhibit low surface energy, low modulus, high gas permeability, and low toxicity with the added feature of being extremely chemically resistant. See Scheirs. J., *Modern Fluoropolymers*; John Wiley & Sons, Ltd.: New York, 1997; pp 435-485. Further, PFPE materials exhibit hydrophobic and lyophobic properties. For this reason, PFPE materials are often used as lubricants on high-performance machinery operating in harsh conditions. The synthesis and solubility of PFPE materials in supercritical carbon dioxide has been reported. See Bunyard. W. et al., *Macromolecules* 1999, 32, 8224-8226.

The presently disclosed subject matter describes the use of a photocurable perfluoropolyether as a material for fabricating a solvent-resistant microfluidic device. The use of a photocurable perfluoropolyether as a material for fabricating a microfluidic device addresses the problems associated with swelling in organic solvents exhibited by microfluidic devices made from other polymeric materials, such as PDMS. Accordingly, PFPE-based microfluidic devices can be used to control the flow of a small volume of a fluid, such as an organic solvent, and to perform microscale chemical reactions that are not amenable to other polymeric microfluidic devices.

SUMMARY

The presently disclosed subject matter describes the use of a photocurable PFPE material for fabricating a solvent-resistant microfluidic device. More particularly, in some embodiments, the presently disclosed subject matter describes a method of forming a patterned layer of a photocured PFPE material. In some embodiments, the method comprises coating a substrate, such as an etched silicon wafer, with a perfluoropolyether precursor and photocuring the perfluoropolyether precursor to form a patterned layer of a photocured perfluoropolyether.

In some embodiments, the presently disclosed subject matter describes a method of forming a multilayer patterned photocured perfluoropolyether material. In some embodiments, the method comprises overlaying a first patterned layer of the photocured perfluoropolyether on a second patterned layer of the photocured perfluoropolyether, wherein the patterns of the first and second layers of the photocured perfluoropolyether are aligned in a predetermined alignment, and then exposing the first and the second layers of the photocured perfluoropolyether to ultraviolet radiation for a period of time. This curing step causes the two layers to adhere to another, thereby creating a seal between the two patterned layers of the photocured perfluoropolyether.

In some embodiments, the multilayer patterned perfluoropolyether structure comprises a plurality of microscale channels, which can further comprise an integrated network of microscale channels. Accordingly, in some embodiments, the presently disclosed subject matter describes a method of flowing a material through an integrated network of microscale channels. In some embodiments, the method of flowing a material comprises actuating a valve structure within the microscale channels. In some embodiments, the method of flowing a material comprises a side-actuated valve structure. In some embodiments, the method of flowing a material comprises flow channels of different shapes and dimensions. In some embodiments, the method of flowing a material comprises actuating multiple valve structures simultaneously to control the flow through a multiplexed network of microscale channels.

In some embodiments, the presently disclosed subject matter describes a method of performing a chemical reaction in a microfluidic device, wherein the method comprises contacting a first reagent and a second reagent in the microfluidic device to form a reaction product. In some embodiments, the first reagent and the second reagent are independently selected from one of a nucleotide and a polynucleotide, wherein the reaction product comprises a polynucleotide. In some embodiments, the polynucleotide is DNA. In some embodiments, the presently disclosed subject matter describes a method of incorporating a microfluidic device into an integrated reaction or flow system.

Further, in some embodiments, the presently disclosed subject matter describes a method of screening a sample for a characteristic. In some embodiments, the presently disclosed subject matter describes a method of dispensing a material. In some embodiments, the presently disclosed subject matter describes a method of separating a material.

Certain objects of the presently disclosed subject matter having been stated hereinabove, which are addressed in whole or in part by the presently disclosed subject matter, other aspects and objects will become evident as the description proceeds when taken in connection with the accompanying Drawings and Examples as best described herein below.

BRIEF DESCRIPTION OF THE DRAWINGS

FIG. 13A: A thin layer (20 µm) and a thick layer (5 mm) of PFPE DMA are partially cured. FIG. 13B: The thick layer is peeled off its wafer, rotated 90°, and placed on top of the thin layer. The entire device is then fully cured to adhere the two layers together. FIG. 13C: The device is peeled off the wafer.

FIGS. 15A-15C depict a photograph illustrating the actuation of a valve. FIG. 15A: Top-down view of the channels containing no solvent. The channels on the thin layer (fluid) run vertically, while those on the thick layer (air) run horizontally. FIG. 15B: Thin-layer channel filled with a dyed solution of acetonitrile, dichloromethane, and methanol. FIG. 15C: Valve actuation produced by introducing 25 psi of air into the thick-layer channel. A schematic representation of the valve is presented beneath each picture.

DETAILED DESCRIPTION

Figure 1A:
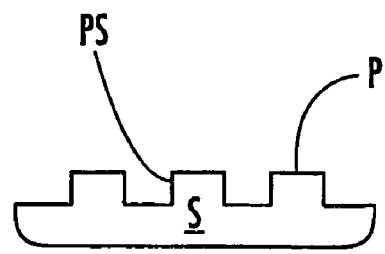
FIGS. 1A-1C are a series of schematic end views depicting the formation of a patterned layer in accordance with the presently disclosed subject matter.

The presently disclosed subject matter will now be described more fully hereinafter with reference to the accompanying Drawings and Examples, in which representative embodiments are shown. The presently disclosed subject matter can, however, be embodied in different forms and should not be construed as limited to the embodiments set forth herein. Rather, these embodiments are provided so that this disclosure will be thorough and complete, and will fully convey the scope of the embodiments to those skilled in the art.

Unless otherwise defined, all technical and scientific terms used herein have the same meaning as commonly understood by one of ordinary skill in the art to which this presently described subject matter belongs. All publications, patent applications, patents, and other references mentioned herein are incorporated by reference in their entirety.

Throughout the specification and claims, a given chemical formula or name shall encompass all optical and stereoisomers, as well as racemic mixtures where such isomers and mixtures exist.

I. Definitions

As used herein, the term "microfluidic device" generally refers to a device through which materials, particularly fluid borne materials, such as liquids, can be transported, in some embodiments on a micro-scale, and in some embodiments on a nano-scale. Thus, the microfluidic devices described by the presently disclosed subject matter can comprise microscale features, nanoscale features, and combinations thereof.

Accordingly, a microfluidic device typically comprises structural or functional features dimensioned on the order of a millimeter-scale or less, which are capable of manipulating a fluid at a flow rate on the order of a microliter/min or less. Typically, such features include, but are not limited to channels, fluid reservoirs, reaction chambers, mixing chambers, and separation regions. In some examples, the channels include at least one cross-sectional dimension that is in a range of from about 0.1 µm to about 500 µm. The use of dimensions on this order allows the incorporation of a greater number of channels in a smaller area, and utilizes smaller volumes of fluids.

A microfluidic device can exist alone or can be a part of a microfluidic system which, for example and without limitation, can include: pumps for introducing fluids, e.g., samples, reagents, buffers and the like, into the system and/or through the system; detection equipment or systems; data storage systems; and control systems for controlling fluid transport and/or direction within the device, monitoring and controlling environmental. conditions to which fluids in the device are subjected, e.g., temperature, current, and the like.

As used herein, the terms "channel," "microscale channel," and "microfluidic channel" are used interchangeably and can mean a recess or cavity formed in a material by imparting a pattern from a patterned substrate into a material or by any suitable material removing technique, or can mean a recess or cavity in combination with any suitable fluid-conducting structure mounted in the recess or cavity, such as a tube, capillary, or the like.

As used herein, the terms "flow channel" and "control channel" are used interchangeably and can mean a channel in a microfluidic device in which a material, such as a fluid, e.g., a gas or a liquid, can flow through. More particularly, the term "flow channel" refers to a channel in which a material of interest, e.g., a solvent or a chemical reagent, can flow through. Further, the term "control channel" refers to a flow channel in which a material, such as a fluid, e.g., a gas or a liquid, can flow through in such a way to actuate a valve or pump.

As used herein, the term "valve" unless otherwise indicated refers to a configuration in which two channels are separated by an elastomeric segment, e.g., a PFPE segment, that can be deflected into or retracted from one of the channels, e.g., a flow channel, in response to an actuation force applied to the other channel, e.g., a control channel.

As used herein, the term "pattern" can mean a channel or a microfluidic channel or an integrated network of microfluidic channels, which, in some embodiments, can intersect at predetermined points. A pattern also can comprise one or more of a microscale fluid reservoir, a microscale reaction chamber, a microscale mixing chamber, and a microscale separation region.

As used herein, the term "intersect" can mean to meet at a point, to meet at a point and cut through or across, or to meet at a point and overlap. More particularly, as used herein, the term "intersect" describes an embodiment wherein two channels meet at a point, meet at a point and cut through or across one another, or meet at a point and overlap one another. Accordingly, in some embodiments, two channels can intersect, i.e., meet at a point or meet at a point and cut through one another, and be in fluid communication with one another. In some embodiments, two channels can intersect, i.e., meet at a point and overlap one another, and not be in fluid communication with one another, as is the case when a flow channel and a control channel intersect.

As used herein, the term "communicate" (e.g., a first component "communicates with" or "is in communication with" a second component) and grammatical variations thereof are used to indicate a structural, functional, mechanical, electrical, optical, or fluidic relationship, or any combination thereof, between two or more components or elements. As such, the fact that one component is said to communicate with a second component is not intended to exclude the possibility that additional components can be present between, and/or operatively associated or engaged with, the first and second components.

In referring to the use of a microfluidic device for handling the containment or movement of fluid, the terms "in", "on", "into", "onto", "through", and "across" the device generally have equivalent meanings.

As used herein, the term "monolithic" refers to a structure comprising or acting as a single, uniform structure.

As used herein, the term "non-biological organic materials" refers to organic materials, i.e., those compounds having covalent carbon-carbon bonds, other than biological materials. As used herein, the term "biological materials" includes nucleic acid polymers (e.g., DNA, RNA) amino acid polymers (e.g., enzymes) and small organic compounds (e.g., steroids, hormones) wherein the small organic compounds have biological activity, especially biological activity for humans or commercially significant animals, such as pets and livestock, and where the small organic compounds are used primarily for therapeutic or diagnostic purposes. While biological materials are of interest with respect to pharmaceutical and biotechnological applications, a large number of applications involve chemical processes that are enhanced by other than biological materials, i.e., non-biological organic materials.

Following long-standing patent law convention, the terms "a", "an", and "the" refer to "one or more" when used in this application, including the claims. Thus, for example, reference to "a microfluidic channel" includes a plurality of such microfluidic channels, and so forth.

II. Method of Making a Microfluidic Device from a Photocurable Perfluoropolyether Material The presently disclosed subject matter describes a method of making a microfluidic device from a photocurable perfluoropolyether (PFPE) material. More particularly, the presently disclosed subject matter describes a method of forming a patterned layer of a photocurable PFPE material. A microfluidic device comprising at least one patterned layer of the photocurable PFPE material also is disclosed.

Figure 1B:
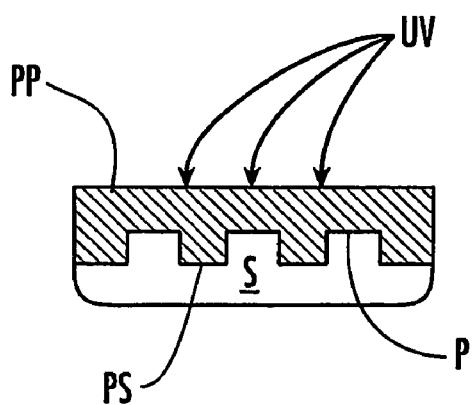
Figure 1C:
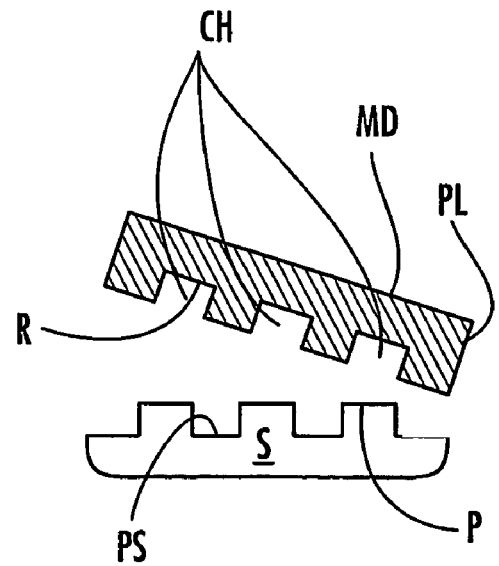

II.A. Method of Forming a Patterned Layer of a Photocurable Perfluoropolyether Material In some embodiments, the presently disclosed subject matter provides a method of forming a patterned layer of a photocurable PFPE material. Referring now to FIGS. 1A-1C, a schematic representation of an embodiment of the presently disclosed subject matter is shown. A substrate S having a patterned surface PS comprising a raised protrusion P is depicted. Accordingly, the patterned surface PS of the substrate S comprises at least one raised protrusion P which forms the shape of a pattern. In some embodiments, the patterned surface PS of the substrate S comprises a plurality of raised protrusions P which form a complex pattern.

As best seen in FIG. 1B, a polymeric precursor PP is disposed on patterned surface PS of substrate S. Polymeric precursor PP can comprise a perfluoropolyether. As shown in FIG. 1B, ultraviolet light UV is applied to provide photocuring of polymeric precursor PP. Upon curing of polymeric precursor PP, a patterned layer PL of a photocured perfluoropolyether as shown in FIG. 1C is formed.

As shown in FIG. 1C, the patterned layer PL of the photocured perfluoropolyether comprises a recess R that is formed in the bottom surface of the patterned layer PL. The dimensions of recess R correspond to the dimensions of the raised protrusion P of patterned surface PS of substrate S. In some embodiments, recess R comprises at least one channel CH, which in some embodiments of the presently disclosed subject matter comprises a microscale channel. Patterned layer PL is removed from patterned surface PS of substrate S to yield microfluidic device MD.

Accordingly, in some embodiments, a method of forming a patterned layer of a photocured perfluoropolyether comprises:
(a) providing a substrate, wherein the substrate comprises a patterned surface;
(b) contacting a perfluoropolyether precursor with the patterned surface of the substrate; and
(c) photocuring the perfluoropolyether precursor to form a patterned layer of a photocured perfluoropolyether.

In some embodiments, a method of forming a patterned layer of a photocured perfluoropolyether comprises:
(a) coating the patterned surface of the substrate with a blend of a perfluoropolyether precursor and a photoinitiator to form a coated, patterned substrate;
(b) exposing the coated, patterned substrate to ultraviolet radiation for a period of time to form a layer of a photocured perfluoropolyether on the patterned substrate; and
(c) removing the layer of the photocured perfluoropolyether from the patterned substrate to produce a patterned layer of the photocured perfluoropolyether.

In some embodiments, the patterned substrate comprises an etched silicon wafer. In some embodiments, the patterned substrate comprises a photoresist patterned substrate. For the purposes of the presently disclosed subject matter, the patterned substrate can be fabricated by any of the processing methods known in the art, including, but not limited to, photolithography, electron beam lithography, and ion milling.

In some embodiments, the coating step comprises a spin-coating step. In some embodiments, the perfluoropolyether precursor comprises poly(tetrafluoroethylene oxide-co-difluoromethylene oxide)a,w diol. In some embodiments, the photoinitiator comprises 2,2-dimethoxy-2-phenyl acetophenone. In some embodiments, the photocured perfluoropolyether comprises a perfluoropolyether dimethacrylate. In some embodiments, the photocured perfluoropolyether comprises a perfluoropolyether distyrenic.

As would be recognized by one of ordinary skill in the art, perfluoropolyethers (PFPEs) have been in use for over 25 years for many applications. Commercial PFPE materials are made by polymerization of perfluorinated monomers. The first member of this class was made by the cesium fluoride catalyzed polymerization of hexafluoropropene oxide (HFPO) yielding a series of branched polymers designated as Krytox® (DuPont, Wilmington, Del., United States of America). A similar polymer is produced by the UV catalyzed photo-oxidation of hexafluoropropene (Fomblin® Y) (Solvay Solexis, Brussels, Belgium). Further, a linear polymer (Fomblin® Z) (Solvay) is prepared by a similar process, but utilizing tetrafluoroethylene. Finally, a fourth polymer (Demnum®) (Daikin Industries, Ltd., Osaka, Japan) is produced by polymerization of tetrafluorooxetane followed by direct fluorination. Structures for these fluids are presented in Table I. Table II contains property data for some members of the PFPE class of lubricants. In addition to these commercially available PFPE fluids, a new series of structures are being prepared by direct fluorination technology. Representative structures of these new PFPE materials appear in Table III. Of the abovementioned PFPE fluids, only Krytox® and Fomblin® Z have been extensively used in applications. See Jones, W. R. Jr., The Properties of Perfluoropolyethers Used for Space Applications, NASA Technical Memorandum 106275 (July 1993), which is incorporated herein by reference in its entirety. Accordingly, the use of such PFPE materials is provided in the presently disclosed subject matter.

TABLE I

Names and Chemical Structures of Commercial PFPE Fluids

| Name | Structure |
|---|---|
| Demnum ® | $C_3F_7O(CF_2CF_2CF_2O)_xC_2F_5$ |
| Krytox ® | $C_3F_7O[CF(CF_3)CF_2O]_xC_2F_5$ |
| Fomblin ® Y | $C_3F_7O[CF(CF_3)CF_2O]_x(CF_2O)_yC_2F_5$ |
| Fomblin ® Z | $CF_3O(CF_2CF_2O)_x(CF_2O)_yCF_3$ |

TABLE II

PFPE Physical Properties

| Lubricant | Average Molecular Weight | Viscosity at 20° C., (cSt) | Viscosity Index | Pour Point, °C. | Vapor Pressure, Torr 20° C. | Vapor Pressure, Torr 100° C. |
|---|---|---|---|---|---|---|
| Fomblin ® Z-25 | 9500 | 255 | 355 | −66 | $2.9 \times 10^{-12}$ | $1 \times 10^{-8}$ |
| Krytox ® 143 AB | 3700 | 230 | 113 | −40 | $1.5 \times 10^{-6}$ | $3 \times 10^{-4}$ |
| Krytox ® 143 AC | 6250 | 800 | 134 | −35 | $2 \times 10^{-8}$ | $8 \times 10^{-6}$ |
| Demnum ® S-200 | 8400 | 500 | 210 | −53 | $1 \times 10^{-10}$ | $1 \times 10^{-7}$ |

TABLE III

Names and Chemical Structures of Representative PFPE Fluids

| Name | Structure[a] |
|---|---|
| Perfluoropoly(methylene oxide) (PMO) | $CF_3O(CF_2O)_xCF_3$ |
| Perfluoropoly(ethylene oxide) (PEO) | $CF_3O(CF_2CF_2O)_xCF_3$ |
| Perfluoropoly(dioxolane) (DIOX) | $CF_3O(CF_2CF_2OCF_2O)_xCF_3$ |
| Perfluoropoly(trioxocane) (TRIOX) | $CF_3O[(CF_2CF_2O)_2CF_2O]_xCF_3$ |

[a]wherein x is any integer.

In some embodiments, the ultraviolet radiation has a wavelength of about 365 nanometers. In some embodiments, the period of time the coated, patterned substrate is exposed to the ultraviolet radiation ranges from about one second to about 300 seconds. In some embodiments, the period of time the coated, patterned substrate is exposed to the ultraviolet radiation ranges from about one second to about 100 seconds. In some embodiments, the period of time the coated, patterned substrate is exposed to the ultraviolet radiation is about six seconds. In some embodiments, the period of time the coated, patterned substrate is exposed to the ultraviolet radiation is about 60 seconds.

In some embodiments, the patterned layer of the photocured perfluoropolyether is between about 0.1 micrometers and about 100 micrometers thick. In some embodiments, the patterned layer of the photocured perfluoropolyether is between about 0.1 millimeters and about 10 millimeters thick. In some embodiments, the patterned layer of the photocured perfluoropolyether is between about one micrometer and about 50 micrometers thick. In some embodiments, the patterned layer of the photocured perfluoropolyether is about 20 micrometers thick. In some embodiments, the patterned layer of the photocured perfluoropolyether is about 5 millimeters thick.

In some embodiments, the patterned layer of the photocured perfluoropolyether comprises a plurality of microscale channels. In some embodiments, the channels have a width ranging from about 0.01 µm to about 1000 µm; a width ranging from about 0.05 µm to about 1000 µm; and/or a width ranging from about 1 µm to about 1000 µm. In some embodiments, the channels have a width ranging from about 1 µm to about 500 µm; a width ranging from about 1 µm to about 250 µm; and/or a width ranging from about 10 µm to about 200 µm. Exemplary channel widths include, but are not limited to, 0.1 µm, 1 µm, 2 µm, 5 µm, 10 µm, 20 µm, 30 µm, 40 µm, 50 µm, 60 µm, 70 µm, 80 µm, 90 µm, 100 µm, 110 µm, 120 µm, 130 µm, 140 µm, 150 µm, 160 µm, 170 µm, 180 µm, 190 µm, 200 µm, 210 µm, 220 µm, 230 µm, 240 µm, and 250 µm.

In some embodiments, the channels have a depth ranging from about 1 μm to about 1000 μm; and/or a depth ranging from about 1 μm to 100 μm. In some embodiments, the channels have a depth ranging from about 0.01 μm to about 1000 μm; a depth ranging from about 0.05 μm to about 500 μm; a depth ranging from about 0.2 μm to about 250 μm; a depth ranging from about 1 μm to about 100 μm; a depth ranging from about 2 μm to about 20 μm; and/or,a depth ranging from about 5 μm to about 10 μm. Exemplary channel depths include, but are not limited to, 0.01 μm, 0.02 μm, 0.05 μm, 0.1 μm, 0.2 μm, 0.5 μm, 1 μm, 2 μm, 3 μm, 4 μm, 5 μm, 7.5 μm, 10 μm, 12.5 μm, 15 μm, 17.5 μm, 20 μm, 22.5 μm, 25 μm, 30 μm, 40 μm, 50 μm, 75 μm, 100 μm, 150 μm, 200 μm, and 250 μm.

In some embodiments, the channels have a width-to-depth ratio ranging from about 0.1:1 to about 100:1. In some embodiments, the channels have a width-to-depth ratio ranging from about 1:1 to about 50:1. In some embodiments, the channels have a width-to-depth ratio ranging from about 2:1 to about 20:1. In some embodiments, the channels have a width-to-depth ratio ranging from about 3:1 to about 15:1. In some embodiments, the channels have a width-to-depth ratio of about 10:1.

One of ordinary skill in the art would recognize that the dimensions of the channels of the presently disclosed subject matter are not limited to the exemplary ranges described hereinabove and can vary in width and depth to affect the magnitude of force required to flow a material through the channel and/or to actuate a valve to control the flow of the material therein. Further, as will be described in more detail herein below, channels of greater width are contemplated for use as a fluid reservoir, a reaction chamber, a mixing channel, a separation region and the like.

II.B. Method of Forming a Multilayer Patterned Photocurable Perfluoropolyether Material In some embodiments, the presently disclosed subject matter describes a method of forming a multilayer patterned photocured perfluoropolyether material. In some embodiments, the multilayer patterned photocured perfluoropolyether material is used to fabricate a monolithic PFPE-based microfluidic device.

Referring now to FIGS. 2A-2D, a schematic representation of the preparation of an embodiment of the presently disclosed subject matter is shown. Patterned layers PL1 and PL2 are provided, each of which comprise a perfluoropolyether material. In this example, each of the patterned layers PL1 and PL2 comprise channels CH. In this embodiment of the presently disclosed subject matter, channels CH are microscale channels. In patterned layer PL1, the channels are represented by a dashed line, i.e., in shadow, in FIGS. 2A-2C. Patterned layer PL2 is overlaid on patterned layer PL1 in a predetermined alignment. In this example, the predetermined alignment is such that channels CH in patterned layer PL1 and PL2 are substantially perpendicular to each other. In some embodiments, as depicted in FIGS. 2A-2D, patterned layer PL1 is overlaid on nonpatterned layer NPL. Nonpatterned layer NPL can comprise a perfluoropolyether.

Figures 2A, 2B, 2C:
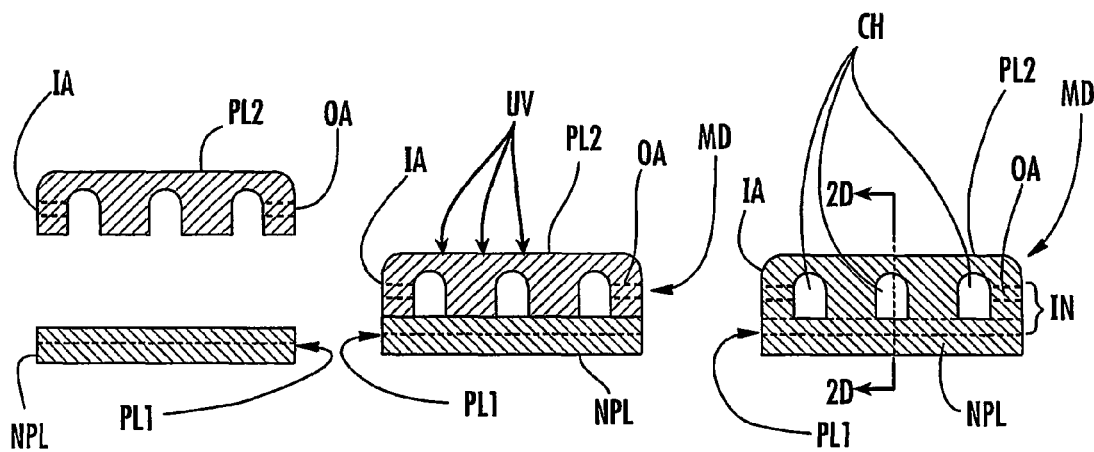
FIGS. 2A-2D are a series of schematic end views depicting the formation of a microfluidic device comprising two patterned layers in accordance with the presently disclosed subject matter.
Figure 2D:
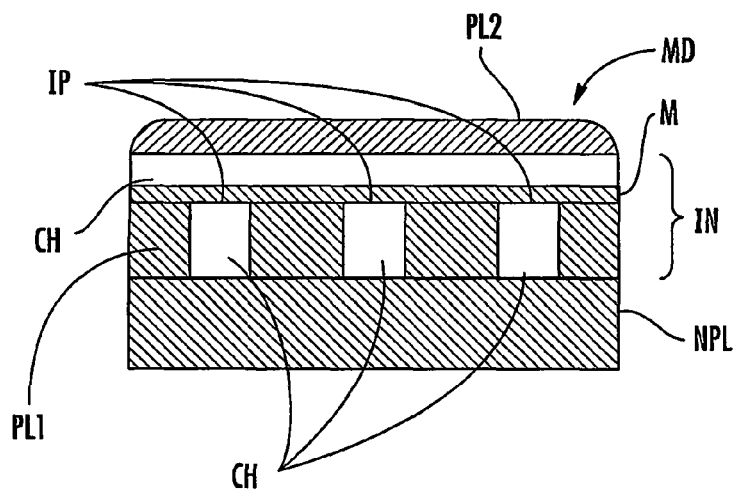

Continuing with reference to FIGS. 2A-2D, patterned layers PL1 and PL2, and in some embodiments nonpatterned layer NPL, are exposed to ultraviolet light UV. The exposing of layers PL1, PL2, and, in some embodiments nonpatterned layer NPL, to ultraviolet light UV provides for the adhering of patterned layers PL1 and PL2 to each other, and in some embodiments, patterned layer PL1 to nonpatterned layer NPL, as shown in FIGS. 2C and 2D. The resulting microfluidic device MD comprises an integrated network IN of microscale channels CH which intersect at predetermined intersecting points IP, as best seen in the cross-section provided in FIG. 2D. Also shown in FIG. 2D is membrane M comprising the top surface of channels CH of patterned layer PL1 which separates channel CH of patterned layer PL2 from channels CH of patterned layer PL1.

Figures 5A, 5B:
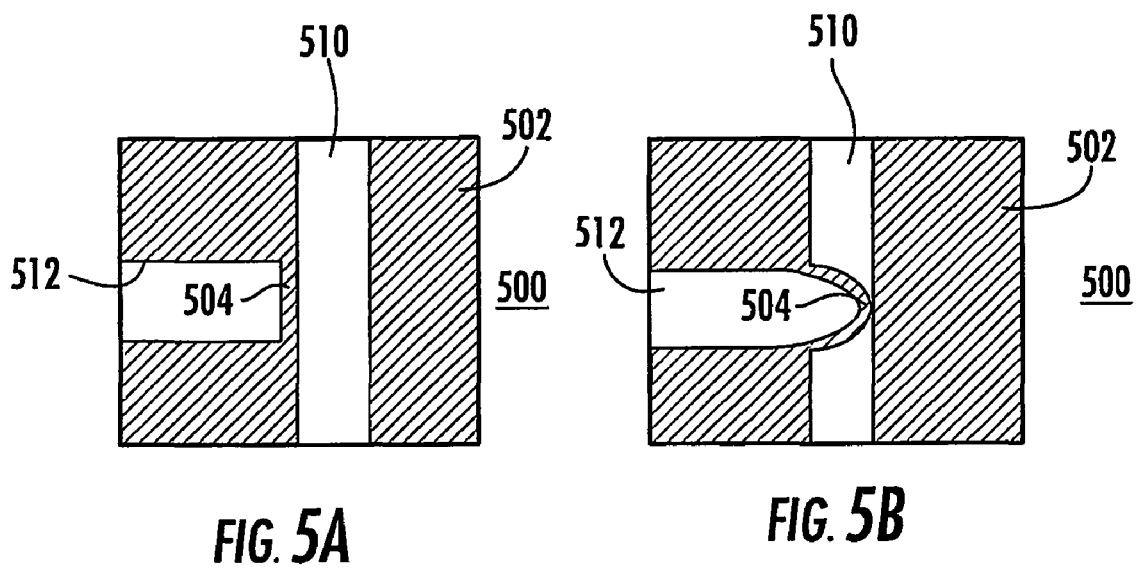
FIG. 5A is a plan view illustrating a side-actuated valve structure in an open position.
FIG. 5B is a plan view illustrating a. side-actuated -valve structure in a closed position.

Continuing with reference to FIGS. 2A-2C, in some embodiments, patterned layer PL2 comprises a plurality of holes, and the holes are designated input aperture IA and output aperture OA. In some embodiments, the holes, e.g., input aperture IA and output aperture OA are in fluid communication with channels CH. In some embodiments, as shown in FIGS. 5A and 5B, and as will be discussed in more detail herein below, the holes comprise a side-actuated valve structure comprising a thin membrane of PFPE material which can be actuated to restrict the flow in an abutting channel.

Accordingly, in some embodiments, the presently disclosed subject matter describes a method of forming a multilayer patterned photocured perfluoropolyether material, the method comprising:

(a) overlaying a first patterned layer of the photocured perfluoropolyether on a second patterned layer of the photocured perfluoropolyether, wherein the patterns of the first and second layers of the photocured perfluoropolyether are aligned in a predetermined alignment; and (b) exposing the first and the second layers of the photocured perfluoropolyether to ultraviolet radiation for a period of time.

In some embodiments, the first patterned layer of photocured PFPE material is cast at such a thickness to impart a degree of mechanical stability to the PFPE structure. Accordingly, in some embodiments, the first patterned layer of the photocured PFPE material is about 50 μm to several centimeters thick. In some embodiments, the first patterned layer of the photocured PFPE material is between 50 μm and about 10 millimeters thick. In some embodiments, the first patterned layer of the photocured PFPE material is 5 mm thick. In some embodiments, the first patterned layer of PFPE material is about 4 mm thick. Further, in some embodiments, the thickness of the first patterned layer of PFPE material ranges from about 0.1 μm to about 10 cm; from about 1 μm to about 5 cm; from about 10 μm to about 2 cm; and from about 100 μm to about 10 mm.

In some embodiments, the second patterned layer of the photocured PFPE material is between about 1 micrometer and about 100 micrometers thick. In some embodiments, the second patterned layer of the photocured PFPE material is between about 1 micrometer and about 50 micrometers thick. In some embodiments, the second patterned layer of the photocured material is about 20 micrometers thick.

Although FIGS. 2A-2C and FIG. 13 disclose the formation of a microfluidic device wherein two patterned layers of PFPE material are combined, in some embodiments of the presently disclosed subject matter it is possible to form a microfluidic device comprising one patterned layer and one non-patterned layer of PFPE material. Thus, the first patterned layer can comprise a microscale channel or an integrated network of microscale channels and then the first patterned layer can be overlaid on top of the non-patterned layer and adhered to the non-patterned layer using a photocuring step, such as application of ultraviolet light as disclosed herein, to form a monolithic structure comprising enclosed channels therein.

Accordingly, in some embodiments, a first and a second patterned layer of photocured perfluoropolyether material, or alternatively a first patterned layer of photocured perfluoropolyether material and a nonpatterned layer of photocured perfluoropolyether material, adhere to one another, thereby forming a monolithic PFPE-based microfluidic device.

III. Method of Directing the Flow of a Material Through a PFPE-Based Microfluidic Device In some embodiments, the presently disclosed subject matter describes a method of directing the flow of a material through a PFPE-based microfluidic device. In some embodiments, the method of directing the flow of a material through a PFPE-based microfluidic device comprises actuating a valve structure or a plurality of valve structures within the microfluidic device. In some embodiments, the valve structure comprises a portion of the microfluidic channel itself. In some embodiments, the valve structure further comprises a side-actuated valve.

Figure 3A:
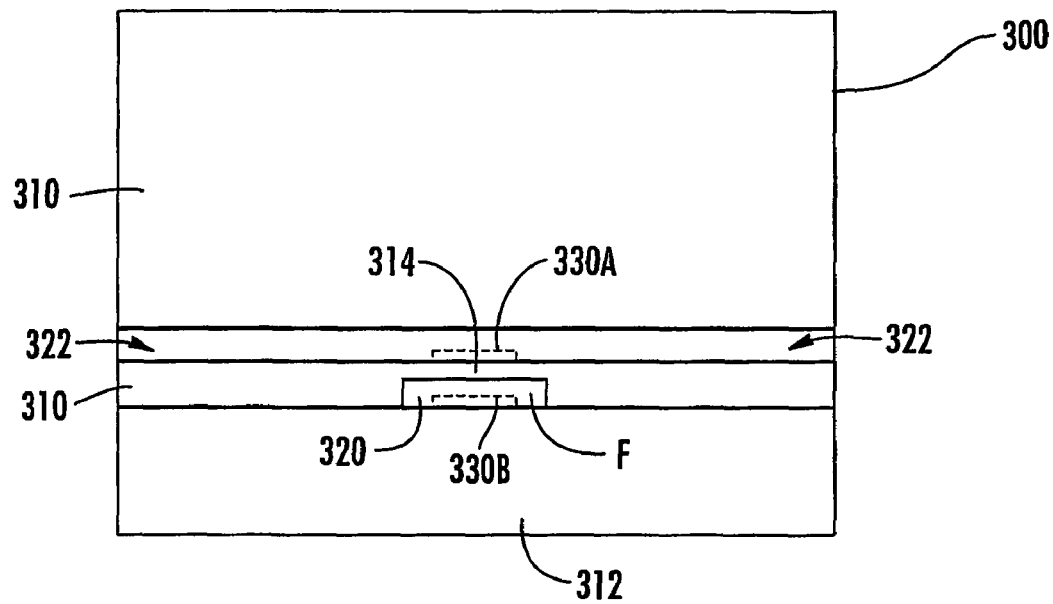
FIG. 3A is a cross-sectional view of a PFPE-based microfluidic device showing an open flow channel.
Figure 3B:
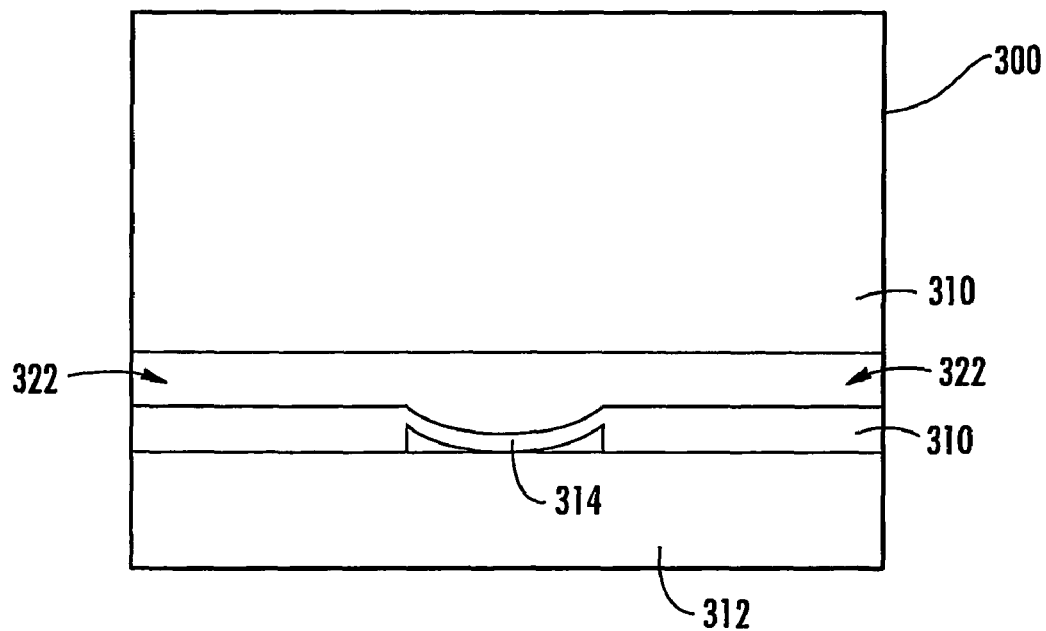
FIG. 3B is a cross-sectional view of a PFPE-based microfluidic device showing a substantially closed flow channel.

III.A. Method of Actuating a Valve Structure Within a PFPE-Based Microfluidic Device In some embodiments, the method of actuating a valve structure within a PFPE-based microfluidic device comprises closing a first flow channel by applying pressure to an abutting second flow channel (or "control channel"), thereby deflecting a thin membrane of PFPE material separating the two channels into the first flow channel. FIGS. 3A and 3B together show the closing of a first flow channel by pressurizing a second flow channel. Referring now to FIG. 3A, a front sectional view of a monolithic PFPE-based microfluidic device 300 comprising a multilayer patterned PFPE material 310 adhered to planar nonpatterned PFPE layer 312 is shown. A first flow channel 320 and a second flow channel 322 are separated by membrane 314, which forms the top of first flow channel 320 and the bottom of second flow channel 322. As depicted in FIG. 3A, flow channel 320 is open.

Referring now to FIG. 3B, pressurization of flow channel 322 (either by a gas or a fluid introduced therein) causes membrane 314 to deflect downward, thereby restricting flow F, as shown in FIG. 3A, passing through flow channel 320. Accordingly, by varying the pressure in channel 322, an actuable valving system is provided such that flow channel 320 can be substantially opened or substantially closed or in an intermediate open or closed position by deflecting membrane 314 as desired. For illustration purposes only, channel 320 in FIG. 3B is shown in a "substantially closed" position, rather than a "fully closed" position.

In some embodiments, the membrane 314 of PFPE material separating overlapping channels 320 and 322 has a thickness between about 0.01 µm and 1000 µm, about 0.05 µm to 500 µm, 0.2 µm to 250 µm, 1 µm to 100 µm, 2 µm to 50 µm, and 5 µm to 40 µm. Exemplary membrane thicknesses include, but are not limited to, 0.01 µm, 0.02 µm, 0.03 µm, 0.05 µm, 0.1 µm, 0.2 µm, 0.3 µm, 0.5 µm, 1 µm, 2 µm, 3 µm, 5 µm, 7.5 µm, 10 µm, 12.5 µm, 15 µm, 17.5 µm, 20 µm, 22.5 µm, 25 µm, 30 µm, 40 µm, 50 µm, 75 µm, 100 µm, 150 µm, 200 µm, 250 µm, 300 µm, 400 µm, 500 µm, 750 µm, and 1000 µm.

Because such valves are actuated by moving a portion of the channels themselves (i.e., deflecting membrane 314) and do not require additional components, valves and pumps produced by this technique have a zero dead volume, and switching valves made by this technique have a dead volume approximately equal to the active volume of the valve, for example about 100 µm×100 µm×10 µm=100 pL. Such dead volumes and areas consumed by the moving membrane are approximately two orders of magnitude smaller than known conventional microvalves. Smaller and larger valves are provided in the presently disclosed subject matter, including, but not limited to, valves comprising a dead volume ranging from 1 aL to 1 µL; 100 aL to 100 nL; 1 fL to 1 nL; 100 fL to 1 nL; and 1 pL to 100 pL.

The small volume of materials, such as a fluid, capable of being delivered by pumps and valves in accordance with the presently disclosed subject matter represent a substantial advantage over pumps and valves known in the art. For example, the smallest known volume of a fluid capable of being manually metered is about 0.1 µL. Further, the smallest known volume of a fluid capable of being metered by automated systems is about 1 µL. Using pumps and valves in accordance with the presently disclosed subject matter, a volume of a fluid comprising 10 nL or smaller can be metered and dispensed. The accurate metering of extremely small volumes of fluid enabled by the presently disclosed subject matter can be extremely valuable in a large number of biological applications, including microscale synthesis of biological materials, such as DNA, and diagnostic tests and assays.

As described in U.S. Pat. No. 6,408,878 to Unger et al., which is incorporated herein by reference in its entirety, the deflection of an elastomeric membrane in response to a pressure is a function of: the length, width, and thickness of the membrane, the flexibility of the membrane, e.g., as provided by its Young's modulus, and the applied actuation force. Because each of these parameters will vary depending on the dimensions and physical composition of a particular elastomeric device, e.g., a PFPE device in accordance with the presently disclosed subject matter, a wide range of membrane thicknesses, channel widths, and actuation forces are provided.

Pressure can be applied to actuate the membrane of the device by passing a fluid or a gas, such as air, through, for example, a first piece of tubing connected to a second, narrower piece of tubing, such as a hypodermic tubing, e.g., a metal hypodermic needle, wherein the metal hypodermic needle is placed into contact with the flow channel by insertion into the PFPE block in a direction normal to the flow channel.

Accordingly, in some embodiments, the method of actuating a PFPE-based microfluidic device further comprises forming a plurality of holes in at least one patterned layer of the photocured perfluoropolyether material. In some embodiments, as shown in FIG. 2A, at least one of the plurality of holes comprises an inlet aperture IA. In some embodiments, as also shown in FIG. 2A, at least one of the plurality of holes comprises an outlet aperture OA.

Further, such an embodiment addresses a number of problems posed by connecting a conventional microfluidic device to an external fluid source. One such problem is the fragility of the connection between the microfluidic device and the external fluid source. Conventional microfluidic devices comprise hard, inflexible materials, such as silicon, to which tubing providing a connection to an external element must be joined. The rigidity of conventional materials creates a physical stress at the points of contact with the external tubing, rendering conventional microfluidic devices prone to fracture and leakage at these contact points.

By contrast, the PFPE material of the presently described subject matter is flexible and can be penetrated for external connection by a rigid tube, such as a metal hypodermic needle, comprising a hard material. For example, in a PFPE structure fabricated using the method shown in FIGS. 1 and 2, a hole extending from the exterior surface of the structure into the flow channel, as shown in FIGS. 2A-2C, can be made by penetrating the external surface of the patterned layer of PFPE material with the metal hypodermic needle after the upper layer of PFPE material has been removed from the mold (as shown in FIG. 1C) and before this layer has been bonded to the second patterned layer of PFPE material (as shown in FIG. 2A-2C).

Between these steps, a portion of the flow channel is exposed to the user's view and is accessible to insertion of the hypodermic needle and proper positioning of the hole. Following completion of fabrication of the device, the metal hypodermic needle is inserted into the hole to complete the fluid connection to the external fluid source. Moreover, the PFPE material of the presently disclosed subject matter will flex in response to physical strain at the point of contact with an external connection, rendering the external physical connection more robust. This flexibility substantially reduces the chance of leakage or fracture of the presently described microfluidic device.

Another disadvantage of conventional microfluidic devices is the difficulty in establishing an effective seal between the device and its connections to an external fluid flow. Because of the narrow diameter of the channels that is typical of these microfluidic devices, achieving even moderate rates of fluid flow can require input high pressures. Accordingly, unwanted leakage at the point of contact between the device and an external connection can result. The flexibility of the PFPE material from which the presently described microfluidic device is fabricated aids in preventing leakage related to high input pressures. More particularly, the flexible PFPE material conforms to the shape of inserted tubing to form a substantially pressure resistant seal.

While control of the flow of material through the device has so far been described using an applied gas pressure, other fluids can be used. A gas is compressible, and thus experiences some finite delay between the time of application of pressure by, for example, an external solenoid valve and the time that this pressure is experienced by the membrane separating the flow channels of the microfluidic device. Accordingly, in some embodiments of the presently disclosed subject matter, pressure is applied from an external source to a non-compressible fluid, such as water or a hydraulic oil, resulting in a near-instantaneous transfer of applied pressure to the membrane. If the displaced volume of the membrane is large or the flow channel is narrow, higher viscosity of the control fluid can contribute to delay in actuation. Therefore, the optimal medium for transferring pressure will depend on the particular application and device configuration. Accordingly, the use of both gaseous and liquid media to actuate the deflectable membrane is provided by the presently disclosed subject matter.

In some embodiments, the external pressure is applied by a pump and tank system through a pressure regulator and external valve. As will be understood by one of ordinary skill in the art, other methods of applying external pressure are provided by the presently disclosed subject matter, including gas tanks, compressors, piston systems, and columns of liquid. Also provided for use in the presently disclosed subject matter are naturally occurring pressure sources, such as those found inside living organisms, including blood pressure, gastric pressure, the pressure present in the cerebro-spinal fluid, pressure present in the intra-ocular space, and the pressure exerted by muscles during normal flexure. Other methods of regulating external pressure also are provided by the presently disclosed subject matter, including miniature valves, pumps, macroscopic peristaltic pumps, pinch valves, and other types of fluid regulating equipment such as is known in the art.

In some embodiments, the response of the microfluidic valves in accordance with the presently disclosed subject matter is nearly linear over a substantial portion of its range of travel, with minimal hysteresis. See U.S. Pat. No. 6,408,878 to Unger et al., which is incorporated herein by reference in its entirety. Accordingly, the valves in accordance with the presently disclosed subject matter are ideally suited for microfluidic metering and fluid control.

While the valves and pumps of the presently disclosed subject matter do not require linear actuation to open and close, a linear response facilitates the use of the valves as metering devices. In some embodiments, the opening of the valve is used to control a flow rate by being partially actuated to a known degree of closure. Linear valve actuation also facilitates the determination of the amount of actuation force required to close the valve to a desired degree of closure. Another benefit of linear actuation is that the force required for valve actuation can be determined from the pressure in the flow channel. Accordingly, if actuation is linear, an increased pressure in the flow channel can be countered by adding the same pressure (force per unit area) to the actuated portion of the valve. Thus, high pressures in the flow channel (i.e., back pressure) can be countered by increasing the actuation pressure.

Linearity of the response of a valve depends on the structure, composition, and method of actuation of the valve structure. Further, whether linearity is a desirable characteristic in a valve depends on the application. Therefore, both linearly and non-linearly actuatable valves are provided in the presently disclosed subject matter, and the pressure ranges over which a valve is linearly actuatable will vary with the specific embodiment.

In addition to the pressure-based actuation systems described hereinabove, electrostatic and magnetic actuation systems also are provided by the presently disclosed subject matter. For example, electrostatic actuation can be accomplished by forming oppositely charged electrodes (which will tend to attract one another when a voltage differential is applied to them) directly into the monolithic PFPE structure. Referring again to FIG. 3A, a first electrode 330A (shown in phantom) can be positioned on (or in) membrane 314 and a second electrode 330B (also shown in phantom) can be positioned on (or in) planar nonpatterned PFPE layer 312. When electrodes 330A and 330B are charged with opposite polarities, an attractive force between the two electrodes will cause membrane 314 to deflect downwardly, thereby closing flow channel 320.

For the membrane electrode to be sufficiently conductive to support electrostatic actuation, but not so mechanically stiff so as to impede the membrane's motion, a sufficiently flexible electrode must be provided in or over membrane 314. Such a sufficiently flexible electrode can be provided by depositing a thin metallization layer on membrane 314, doping the polymer with conductive material, or making the surface layer out of a conductive material.

In some embodiments, the electrode present at the deflecting membrane is provided by a thin metallization layer, which can be provided, for example, by sputtering a thin layer of metal, such as 20 nm of gold. In addition to the formation of a metallized membrane by sputtering, other metallization approaches, such as chemical epitaxy, evaporation, electroplating, and electroless plating, also are available. Physical transfer of a metal layer to the surface of the elastomer also is available, for example by evaporating a metal onto a flat substrate to which it adheres poorly, and then placing the elastomer onto the metal and peeling the metal off of the substrate.

The conductive electrode 330A also can be formed by depositing carbon black (e.g., Vulcan® XC72R Cabot Corporation, Boston, Mass., United States of America) on the elastomer surface. Alternatively, the electrode 330A can be formed by constructing the entire structure 300 out of elastomer doped with conductive material (i.e., carbon black or finely divided metal particles). The electrode also can be formed by electrostatic deposition, or by a chemical reaction that produces carbon.

The lower electrode 330B, which is not required to move, can be either a compliant electrode as described above, or a conventional electrode, such as evaporated gold, a metal plate, or a doped semiconductor electrode.

In some embodiments, magnetic actuation of the flow channels can be achieved by fabricating the membrane separating the flow channels with a magnetically polarizable material, such as iron, or a permanently magnetized material, such as polarized NdFeB.

In embodiments wherein the membrane is fabricated with a magnetically polarizable material, the membrane can be actuated by attraction in response to an applied magnetic field. In embodiments wherein the membrane is fabricated with a material capable of maintaining permanent magnetization, the material can first be magnetized by exposure to a sufficiently high magnetic field, and then actuated either by attraction or repulsion in response to the polarity of an applied inhomogeneous magnetic field.

The magnetic field causing actuation of the membrane can be generated in a variety of ways. In some embodiments, the magnetic field is generated by a small inductive coil formed in or proximate to the elastomer membrane. The actuation effect of such a magnetic coil is localized, thereby allowing actuation of an individual pump and/or valve structure. In some embodiments, the magnetic field is generated by a larger, more powerful source, in which case actuation is not localized and can actuate multiple pump and/or valve structures simultaneously.

It is further possible to combine pressure actuation with electrostatic or magnetic actuation. More particularly, a bellows structure in fluid communication with a recess and/or channel could be electrostatically or magnetically actuated to change the pressure in the recess and/or channel and thereby actuate a membrane structure adjacent to the recess and/or channel.

In addition to electrical or magnetic actuation as described above, electrolytic and electrokinetic actuation systems also are provided by the presently disclosed subject matter. For example, in some embodiments, actuation pressure on the membrane arises from an electrolytic reaction in a recess and/or channel overlying the membrane. In such an embodiment, electrodes present in the recess and/or channel apply a voltage across an electrolyte in the recess and/or channel. This potential difference causes electrochemical reaction at the electrodes and results in the generation of gas species, giving rise to a pressure differential in the recess and/or channel.

In some embodiments, actuation pressure on the membrane arises from an electrokinetic fluid flow in the control channel. In such an embodiment, electrodes present at opposite ends of the control channel apply a potential difference across an electrolyte present in the control channel. Migration of charged species in the electrolyte to the respective electrodes gives rise to a pressure differential.

In some embodiments, it is possible to actuate the device by causing a fluid flow in the control channel based upon the application of thermal energy, either by thermal expansion or by production of a gas from a liquid. Similarly, chemical reactions generating gaseous products can produce an increase in pressure sufficient for membrane actuation.

III.B. Method of Actuating a Valve Structure Within a PFPE-Based Microfluidic Device Comprising Flow Channels of Different Cross Sectional Sizes and Shapes In some embodiments, the presently disclosed subject matter describes flow channels comprising different cross sectional sizes and shapes, offering different advantages depending on their desired application, in particular, advantages with regard to sealing a flow channel. For example, the cross sectional shape of the lower flow channel can have a curved upper surface, either along its entire length or in the region disposed under an upper cross channel.

Figure 4A:
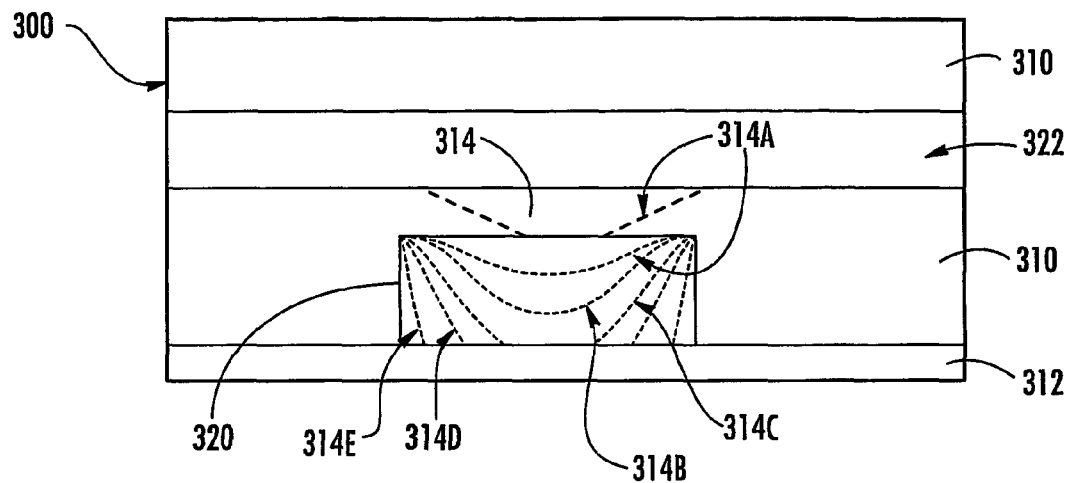
FIG. 4A is a cross-sectional view of a rectangular flow channel.
Figure 4B:
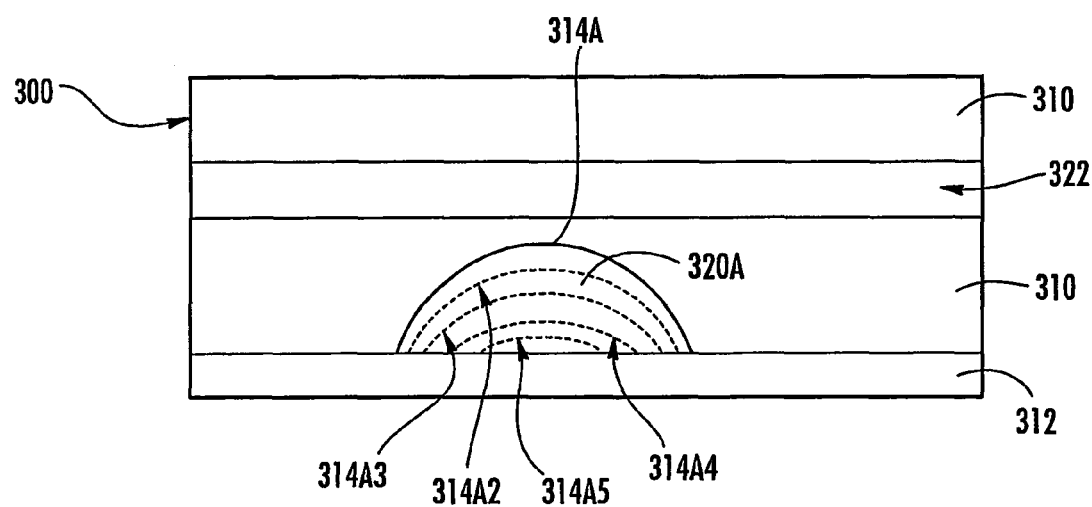
FIG. 4B is a cross-sectional view of a flow channel having a curved upper surface.

Referring now to FIG. 4A, a cross sectional view similar to that of FIG. 3A of flow channels 320 and 322 is shown. In this embodiment, flow channel 320 is rectangular in cross sectional shape. In some embodiments, as shown in FIG. 4B, the cross-section of flow channel 320 has a curved upper surface as depicted by 320A.

Referring again to FIG. 4A, when flow channel 322 is pressurized, the membrane portion 314 separating flow channels 320 and 322 will move downwardly to the successive positions shown by the dotted lines 314A, 314B, 314C, 314D, and 314E. In some cases, incomplete sealing can occur at the edges of rectangular flow channel 320 and adjacent planar nonpatterned PFPE layer 312.

Referring again to FIG. 4B, flow channel 320A has a curved upper surface 314A. When flow channel 322 is pressurized, membrane portion 314 will move downwardly to the successive positions shown by dotted lines 314A2, 314A3, 314A4 and 314A5, with edge portions of the membrane moving first into the flow channel, followed by top membrane portions. An advantage of having such a curved upper surface at membrane 314 is that a more complete seal will be provided when flow channel 322 is pressurized. More particularly, the upper surface of flow channel 320A will provide a continuous contacting edge against nonpatterned PFPE layer 312, thereby avoiding the incomplete contact seen between membrane 314 and the bottom of flow channel 320 in FIG. 4A.

Another advantage of having a curved upper flow channel surface at membrane 314 is that the membrane can more readily conform to the shape and volume of the flow channel in response to actuation. More particularly, when a rectangular flow channel is employed, the entire perimeter (2×flow channel height, plus the flow channel width) must be forced into the flow channel. When a curved flow channel is used, a smaller perimeter of material (only the semi-circular arched portion) must be forced into the channel. In this manner, the membrane requires less change in perimeter for actuation and is therefore more responsive to an applied actuation force to close the flow channel.

In some embodiments, (not illustrated), the bottom of flow channel 320 is rounded such that its curved surface mates with the curved upper surface 314A as seen in FIG. 4B described above.

In summary, the actual conformational change experienced by the membrane upon actuation will depend on the configuration of the particular PFPE structure. More particularly, the conformational change will depend on the length, width, and thickness profile of the membrane, its attachment to the remainder of the structure, and the height, width, and shape of the flow and control channels and the material properties of the PFPE material used. The conformational change also can depend on the method of actuation, as actuation of the membrane in response to an applied pressure will vary somewhat from actuation in response to a magnetic or electrostatic force.

Moreover, the desired conformational change in the membrane will also vary depending on the particular application for the PFPE structure. In the embodiments described above, the valve can either be open or closed, with metering to control the degree of closure of the valve.

Many membrane thickness profiles and flow channel cross-sections are provided by the presently disclosed subject matter, including rectangular, trapezoidal, circular, ellipsoidal, parabolic, hyperbolic, and polygonal, as well as sections of the aforementioned shapes. More complex cross-sectional shapes, such as the embodiment with protrusions discussed immediately above or an embodiment comprising concavities in the flow channel, also are provided by the presently disclosed subject matter.

III.C. Method of Actuating a Side-Actuated Valve Structure

In some embodiments, the presently disclosed subject matter comprises a side-actuated valve structure. Referring now to FIGS. 5A and 5B, FIG. 5A shows a side-actuated valve structure 500 in an unactuated position. Flow channel 510 is formed in PFPE layer 502. Control channel 512 abutting flow channel 510 also is formed in PFPE layer 502. In some embodiments, control channel 512 comprises a "hole" formed by, for example, puncturing the PFPE layer with a hypodermic needle as described hereinabove. Control channel 512 is separated from flow channel 510 by PFPE membrane portion 504. A second PFPE layer (not shown) is bonded over bottom PFPE layer 502, for example by photocuring, to enclose flow channel 510 and control channel 512.

FIG. 5B shows side-actuated valve structure 500 in an actuated position. In response to pressure, or other actuation technique, within control channel 512, membrane 504 deforms into flow channel 510, blocking flow channel 510. Upon release of pressure within control channel 512, membrane 504 relaxes back into control channel 512 and open flow channel 510.

While a side-actuated valve structure actuated in response to pressure is shown in FIGS. 5A and 5B, a side-actuated valve in accordance with the presently disclosed subject matter is not limited to this configuration. In some embodiments, the PFPE membrane portion located between the abutting flow and control channels is manipulated by electric or magnetic fields, as described hereinabove.

III.D. Method of Actuating an Integrated Network of Microscale Channels Comprising a PFPE-Based Microfluidic Device In some embodiments, the predetermined alignment of the first and second layers of the photocured perfluoropolyether material forms a plurality of microscale channels. In some embodiments, the plurality of microscale channels comprises an integrated network of microscale channels. In some embodiments, the microscale channels of the integrated network intersect at predetermined intersecting points.

Figure 6A:
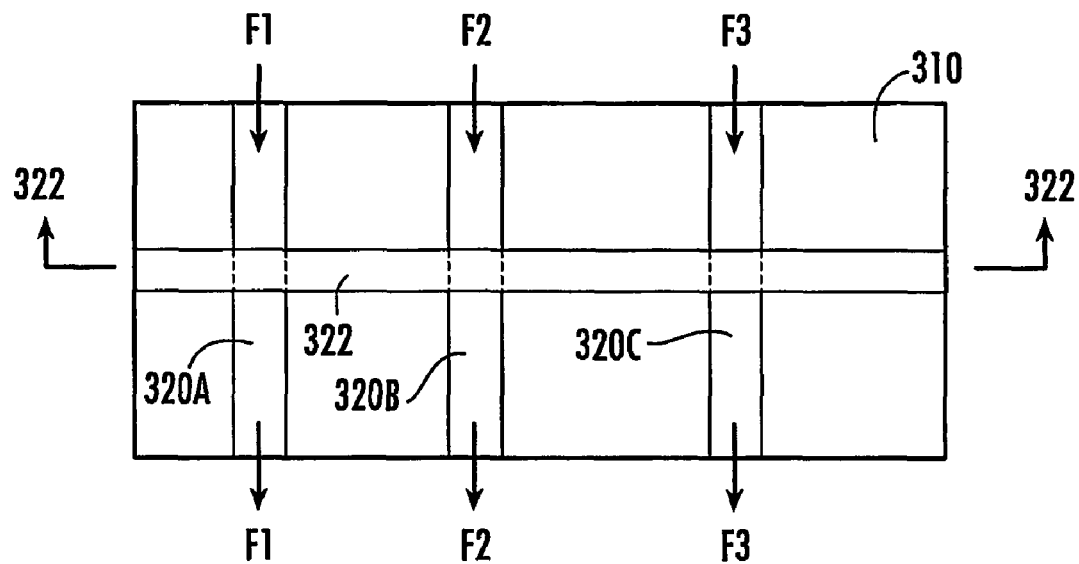
FIG. 6A is a top schematic view of one control channel actuating multiple flow channels simultaneously.
Figure 6B:
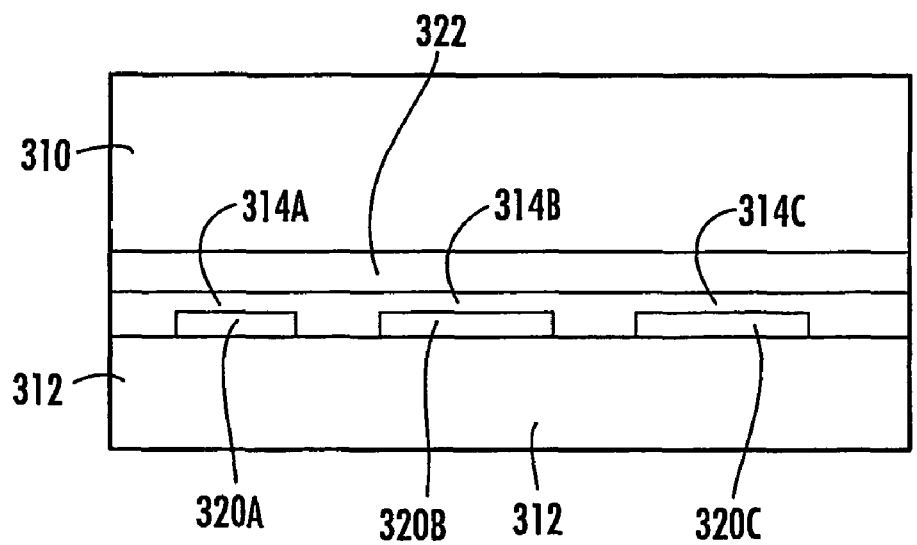
FIG. 6B is a sectional elevation view along control channel 322 as shown in FIG. 6A.

Referring now to FIGS. 6A and 6B, a schematic view of a plurality of flow channels which are controllable by a single control channel is shown. This system is comprised of a plurality of single addressable on/off valves multiplexed together. More particularly, a plurality of parallel flow channels 320A, 320B, and 320C are provided. Flow channel 322 (i.e., a "control line") passes over flow channels 320A, 320B, and 320C. Pressurization of control line 322 simultaneously shuts off flows F1, F2, and F3 by depressing membranes 314A, 314B, and 314C located at the intersections of control line 322 and flow channels 320A, 320B, and 320C.

Figure 7:
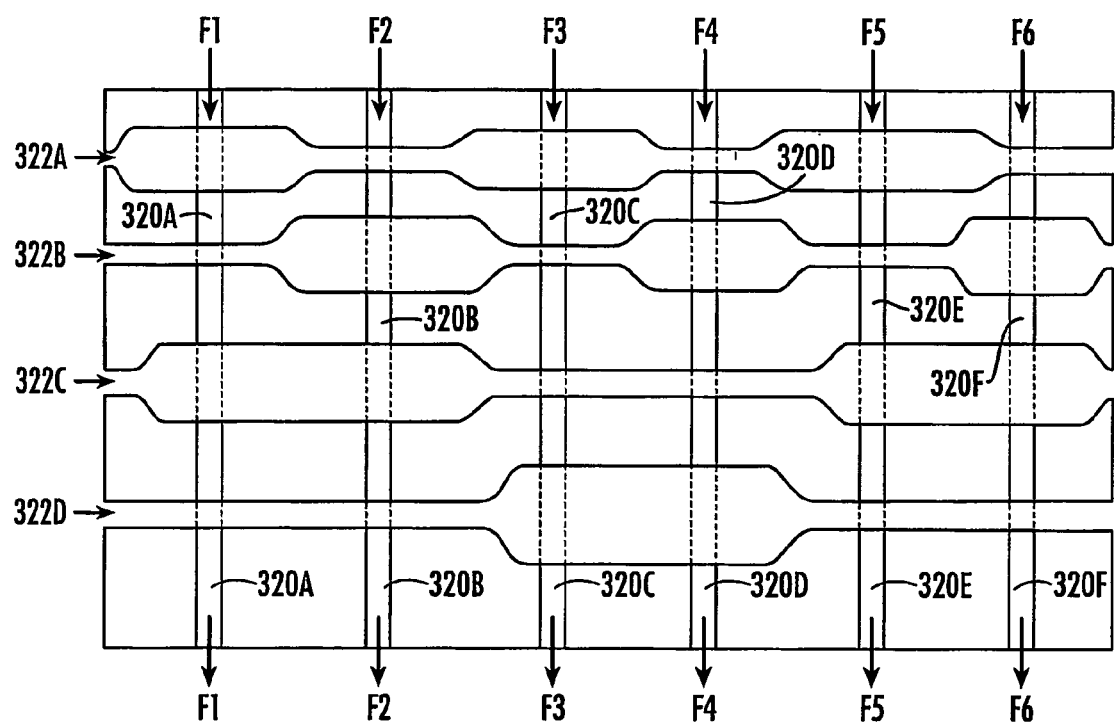
FIG. 7 is a schematic illustration of a multiplexed system adapted to permit flow through various channels.

Referring now to FIG. 7, a schematic illustration of a multiplexing system adapted to permit fluid flow through selected channels, comprised of a plurality of the single on/off valves, joined or networked together is shown. A plurality of parallel flow channels 320A, 320B, 320C, 320D, 320E, and 320F are positioned under a plurality of parallel control lines 322A, 322B, 322C, and 322D. Control channels 322A, 322B, 322C, and 322D are actuated to shut off fluid flows F1, F2, F3, F4, F5, and F6 passing through parallel flow channels 320A, 320B, 320C, 320D, 320E, and 320F using any of the valving systems described above, with the following modification.

The downward deflection of membranes separating the respective flow channels from a control line passing thereabove (for example, membranes 314A, 314B, and 314C in FIGS. 6A and 6B) depends on the membrane dimensions. Accordingly, by varying the widths of flow channel control line 322 in FIGS. 6A and 6B, it is possible to have a control line pass over multiple flow channels, yet only actuate (i.e., close) desired flow channels. Each of control lines 322A, 322B, 322C, and 322D have both wide and narrow portions. For example, control line 322A is wide in locations disposed over flow channels 320A, 320C, and 320E. Similarly, control line 322B is wide in locations disposed over flow channels 320B, 320D and 320F, and control line 322C is wide in locations disposed over flow channels 320A, 320B, 320E, and 320F.

At the locations where the respective control line is wide, its pressurization causes the membrane 314 separating the flow channel and the control line (as shown in FIG. 6B) to depress significantly into the flow channel, thereby blocking the flow passage therethrough. Conversely, in the locations where the respective control line is narrow, membrane 314 also is narrow. Accordingly, the same degree of pressurization will not result in membrane 314 becoming depressed into the flow channel 320. Therefore, fluid passage thereunder will not be blocked.

For example, when control line 322A is pressurized, it blocks flows F1, F3, and F5 in flow channels 320A, 320C, and 320E, respectively. Similarly, when control line 322C is pressurized, it blocks flows F1, F2, F5, and F6 in flow channels 320A, 320B, 320E, and 320F, respectively. As will be appreciated by one of ordinary skill in the art upon review of the present disclosure, more than one control line can be actuated at the same time. For example, control lines 322A and 322C can be pressurized simultaneously to block all fluid flow except F4 (with control line 322A blocking F1, F3, and F5; and control line 322C blocking F1, F2, F5, and F6).

By selectively pressurizing different control lines 322A-D both together and in various sequences, a degree of fluid flow control can be achieved. Moreover, by extending the present system to more than six parallel flow channels 320A-F and more than four parallel control lines 322A-D, and by varying the positioning of the wide and narrow regions of the control lines, complex fluid flow control systems can be fabricated.

IV. Method of Using a PFPE-Based Microfluidic Device

In some embodiments, the presently disclosed subject matter describes a method of flowing a material and/or performing a chemical reaction in a PFPE-based microfluidic device. In some embodiments, the presently disclosed subject matter describes a method of synthesizing a biopolymer, such as DNA. In some embodiments, the presently disclosed subject matter describes a method of screening a sample for a characteristic. In some embodiments, the presently disclosed subject matter disclosed a method of dispensing a material. In some embodiments, the presently disclosed subject matter discloses a method of separating a material.

Figure 8:
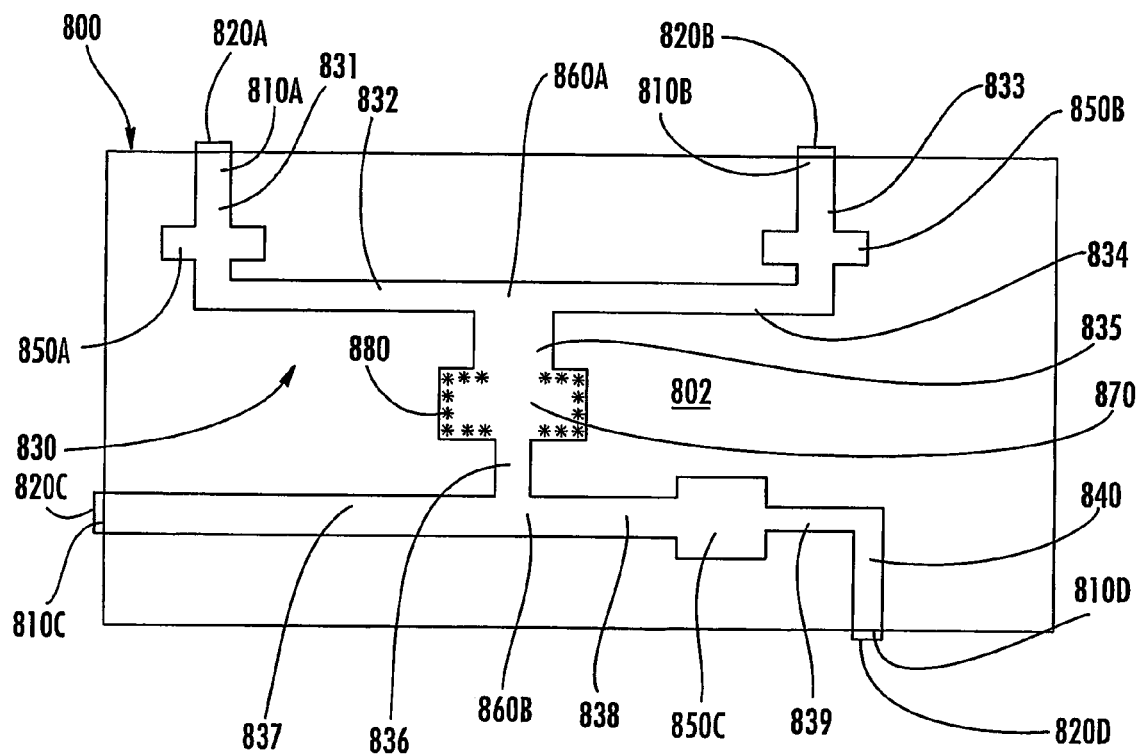
FIG. 8 is a schematic plan view of a microfluidic device in accordance with the presently disclosed subject matter.

IV.A. Method of Flowing a Material and/or Performing a Chemical Reaction in a PFPE-Based Microfluidic Device In some embodiments, the presently disclosed subject mater describes a method of flowing a material and/or performing a chemical reaction in a PFPE-based microfluidic device. Referring now to FIG. 8, a schematic plan view of a microfluidic device of the presently disclosed subject matter is shown. The microfluidic device is referred to generally at 800. Microfluidic device 800 comprises a patterned layer 802, and a plurality of holes 810A, 810B, 810C, and 810D. These holes can be further described as inlet aperture 810A, inlet aperture 810B, and inlet aperture 810C, and outlet aperture 810D. Each of apertures 810A, 810B, 810C, and 810D are covered by seals 820A, 820B, 820C, and 820D, which are preferably reversible seals. Seals 820A, 820B, 820C, and 820D are provided so that materials, including but not limited to, solvents, chemical reagents, components of a biochemical system, samples, inks, and reaction products and/or mixtures of solvents, chemical reagents, components of a biochemical system, samples, inks, reaction products and combinations thereof, can be stored; shipped, or otherwise maintained in microfluidic device 800 if desired. Seals 820A, 820B, 820C, and 820D can be reversible, that is, removable, so that microfluidic device 800 can be implemented in a chemical reaction or other use and then can be resealed if desired.

Continuing with reference to FIG. 8, in some embodiments, apertures 810A, 810B, and 810C, further comprise pressure actuated valves (comprising intersecting, overlaid flow channels not shown) which can be actuated to seal the microfluidic channel associated the aperture.

Continuing with reference to FIG. 8, patterned layer 802 of microfluidic device 800 comprises an integrated network 830 of microscale channels. Integrated network 830 thus comprises a series of fluidly connected microscale channels designated by the following reference characters: 831, 832, 833, 834, 835, 836, 837, 838, 839, and 840. Thus, inlet aperture 810A is in fluid communication with microscale channel 831 which extends away from aperture 810A and is in fluid communication with microscale channel 832 via a bend. In integrated network 830 depicted in FIG. 8, a series of 90° bends are shown for convenience. It is noted, however, that the paths and bends provided in the channels of integrated network 830, can encompass any desired configuration, angle, or other characteristic. Indeed, fluid reservoirs 850A and 850B can be provided along microscale channels 831, 832, 833, and 834, respectively, if desired. As shown in FIG. 8, fluid reservoirs 850A and 850B comprise at least one dimension that is greater than a dimension of the channels that are immediately adjacent to them.

Continuing, then, with reference to FIG. 8, microscale channels 832 and 834 intersect at intersecting point 860A and proceed into a single microscale channel 835. Microscale channel 835 proceeds to a chamber 870, which in the embodiment shown in FIG. 8, is dimensioned to be wider than microscale channel 835. In some embodiments, chamber 870 comprises a reaction chamber. In some embodiments, chamber 870 comprises a mixing chamber. In some embodiments, chamber 870 comprises a separation region. In some embodiments, the separation region comprises a given dimension, e.g., length, of a channel, wherein the material is separated by charge, or mass, or combinations thereof, or any other physical characteristic wherein a separation can occur over a given dimension: In some embodiments, the separation region comprises an active material 880. As would be understood by one of ordinary skill in the art, the term "active material" is used herein for convenience and does not imply that the material must be activated to be used for its intended purpose. In some embodiments, the active material is a chromatographic material. In some embodiments, the active material is a target material.

Continuing with FIG. 8, it is noted that chamber 870 does not necessarily need to be of a wider dimension than an adjacent microscale channel. Indeed chamber 870 can simply comprise a given segment of a microscale channel wherein at least two materials are separated, mixed, and/or reacted. Extending from chamber 870 substantially opposite from microscale channel 835 is microscale channel 836. Microscale channel 836 forms a T-junction with microscale channel 837 which extends away from and is in fluid communication with aperture 810C. Thus, the junction of microscale channels 836 and 837 form intersecting point 860B. Microscale channel 838 extends from intersecting point 860B in a direction substantially opposite microscale channel 837 and to fluid reservoir 850C. Fluid reservoir 850C is dimensioned to be wider than microscale channel 838 for a predetermined length. As noted above, however, a given section of a microscale channel can act as a fluid reservoir without the need to necessarily change a dimension of the section of microscale channel. Moreover, microscale channel 838 could act as a reaction chamber in that a reagent flowing from microscale channel 837 to intersection point 860B could react with a reagent moving from microscale channel 836 to intersection point 860B and into microscale channel 838.

Continuing with reference to FIG. 8, microscale channel 839 extends from fluid reservoir 850C substantially opposite microfluidic channel 838 and travels through a bend into microscale channel 840. Microscale channel 840 is fluidly connected to outlet aperture 810D. Outlet aperture 810D can optionally be reversibly sealed via seal 820D, as discussed above. Again, the reversible sealing of outlet aperture 810D can be desirable in the case of an embodiment where a reaction product is formed in microfluidic device 800 and is desired to be transported to another location in microfluidic device 800.

The flow of a material can be directed through the integrated network 830 of microscale channels, including channels, fluid reservoirs, and reaction chambers, by the method described in FIG. 7.

Accordingly, in some embodiments, the presently disclosed subject matter comprises a method of flowing a material in a microfluidic device, the method comprising: (a) providing a microfluidic device comprising at least one patterned layer of a photocured perfluoropolyether, wherein the patterned layer of the photocured perfluoropolyether comprises at least one microscale channel; and (b) flowing a material in the microscale channel.

Figure 10:
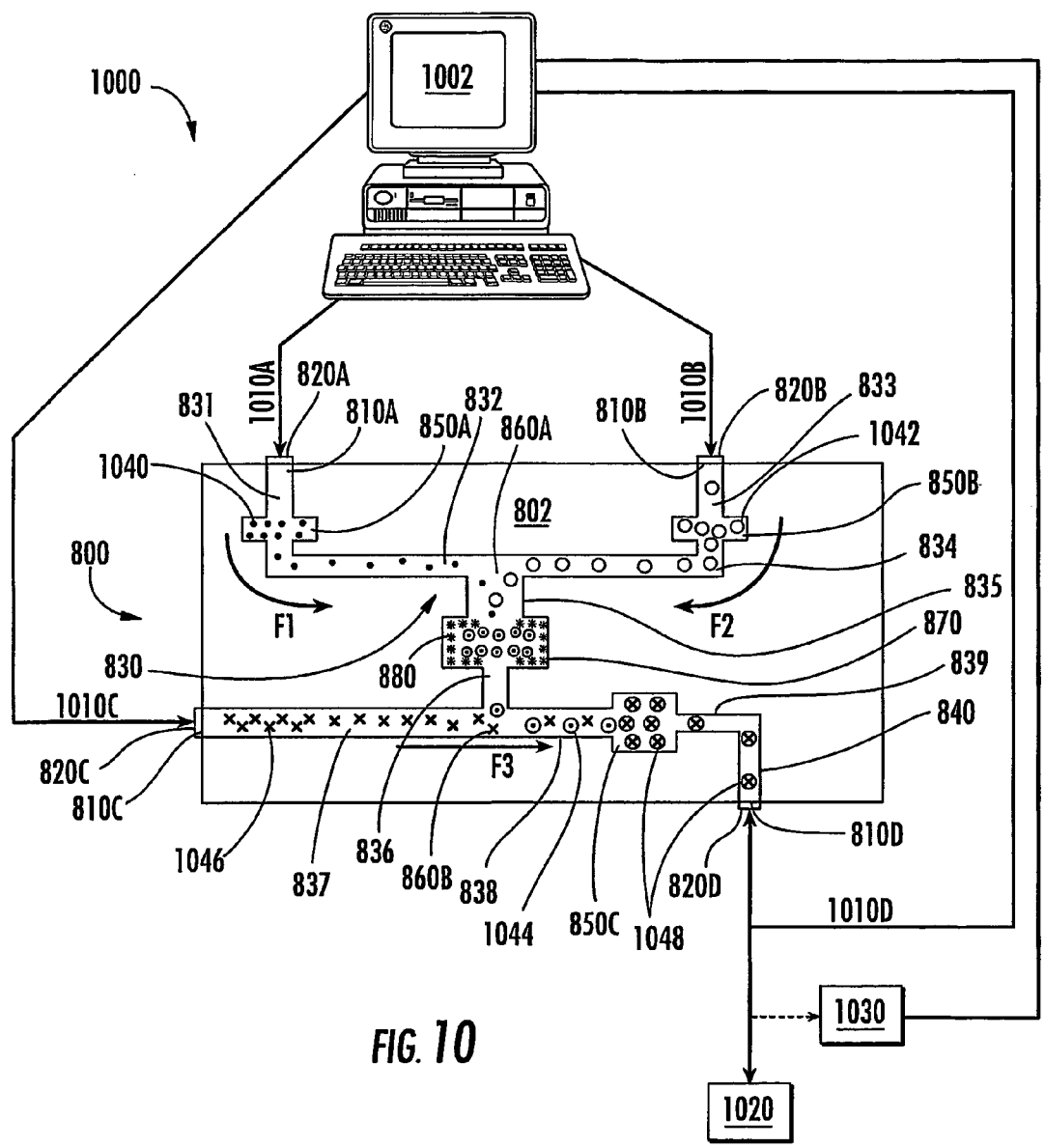
FIG. 10 is schematic view of a system for flowing a solution or conducting a chemical reaction in a microfluidic device in accordance with the presently disclosed subject matter. The microfluidic device 800 is depicted as a schematic plan view as shown in FIG. 8.

In some embodiments, the method comprises disposing a material in the microfluidic device. In some embodiments, as is best shown in FIG. 10 and as discussed in more detail herein below, the method comprises applying a driving force to move the material along the microscale channel. In some embodiments, the method further comprises a plurality of microscale channels. In some embodiments, the plurality of microscale channels comprises an integrated network of microscale channels. In some embodiments, the microscale channels of the integrated network intersect at predetermined points. In some embodiments, the patterned layer of the photocured perfluoropolyether comprises a plurality of holes. In some embodiments, at least one of the plurality of holes comprises an inlet aperture. In some embodiments, at least one of the plurality of holes comprises an outlet aperture. In some embodiments, the method comprises at least one pressure actuated valve, wherein the pressure actuated valve is defined by one of: (a) a microscale channel; and (b) at least one of the plurality of holes. In some embodiments, the pressure actuated valve is actuated by introducing a pressurized fluid into one of: (a) a microscale channel; and (b) at least one of the plurality of holes.

In some embodiments, the pressurized fluid has a pressure between about 10 psi and about 40 psi. In some embodiments, the pressure is about 25 psi. In some embodiments, the material comprises a fluid. In some embodiments, the fluid comprises a solvent. In some embodiments, the solvent comprises an organic solvent. In some embodiments, the material flows in a predetermined direction along the microscale channel.

Further, in some embodiments, the presently disclosed subject matter describes a method of performing a chemical reaction, the method comprising:
  (a) providing a microfluidic device comprising a patterned layer of a photocured perfluoropolyether; and
  (b) contacting a first reagent and a second reagent in the microfluidic device to form a reaction product.

In some embodiments, the patterned layer of the photocured perfluoropolyether comprises a plurality of microscale channels. In some embodiments, at least one of the microscale channels comprises a fluid reservoir. In some embodiments, at least one of the microscale channels comprises a fluid reaction chamber in fluid communication with the fluid reservoir.

In some embodiments, the method further comprises flowing the first reagent and the second reagent in a predetermined direction in the microfluidic device. In some embodiments, the contacting of the first reagent and the second reagent is performed in a microscale reaction chamber. In some embodiments, the method further comprises flowing the reaction product in a predetermined direction in the microfluidic device.

In some embodiments, the method further comprises recovering the reaction product. In some embodiments, the method further comprises flowing the reaction product to an outlet aperture of the microfluidic device.

In some embodiments, the method further comprises contacting the reaction product with a third reagent to form a second reaction product. In some embodiments, the first reagent and the second reagent comprise an organic solvent, including, but not limited to, hexanes, ethyl ether, toluene, dichloromethane, acetone, and acetonitrile.

IB. Method of Synthesizing a Biopolymer in a PFPE-Based Microfluidic Device

In some embodiments, the presently disclosed PFPE-based microfluidic device can be used in biopolymer synthesis, for example, in synthesizing oligonucleotides, proteins, peptides, DNA, and the like. In some embodiments, such biopolymer synthesis systems comprise an integrated system comprising an array of reservoirs, fluidic logic for selecting flow from a particular reservoir, an array of channels, reservoirs, and reaction chambers in which synthesis is performed, and fluidic logic for determining into which channels the selected reagent flows.

Figure 9:
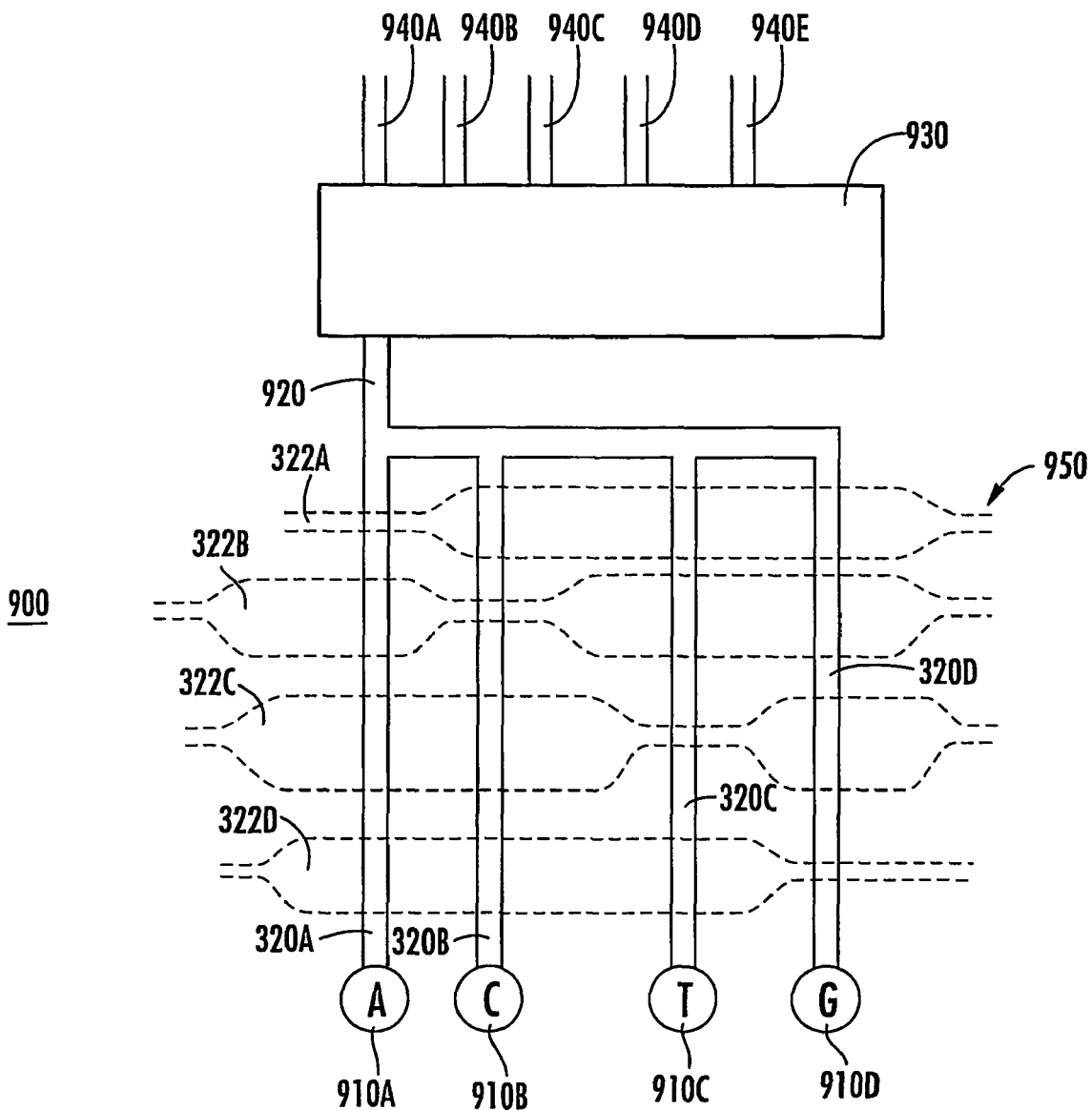
FIG. 9 is a schematic of an integrated microfluidic system for biopolymer synthesis.

Referring now to FIG. 9, a plurality of reservoirs, e.g., reservoirs 910A, 910B, 910C, and 910D, have bases A, C, T, and G respectively disposed therein, as shown. Four flow channels 320A, 320B, 320C, and 320D are connected to reservoirs 910A, 910B, 910C, and 910D. Four control channels 322A, 322B, 322C, and 322D (shown in phantom) are disposed there across with control channel 322A permitting flow only through flow channel 320A (i.e., sealing flow channels 320B, 320C, and 320D), when control channel 322A is pressurized. Similarly, control channel 322B permits flow only through flow channel 320B when pressurized. As such, the selective pressurization of control channels 322A, 322B, 322C, and 322D sequentially selects a desired base A, C, T, and G from a desired reservoir 910A, 910B, 910C, or 910D. The fluid then passes through flow channel 920 into a multiplexed channel flow controller 930, (including, for example, any system as shown in FIGS. 7 and 8) which in turn directs fluid flow into one or more of a plurality of synthesis channels or reaction chambers 940A, 940B, 940C, 940D, or 940E in which solid phase synthesis may be carried out.

In some embodiments, instead of starting from the desired base A, C, T, and G, a reagent selected from one of a nucleotide and a polynucleotide is disposed in at least one of reservoir 910A, 910B, 910C, and 910D. In some embodiments, the reaction product comprises a polynucleotide. In some embodiments, the polynucleotide is DNA.

Accordingly, after a review of the present disclosure, one of ordinary skill in the art would recognize that the presently disclosed PFPE-based microfluidic device can be used to synthesize biopolymers, as described in U.S. Pat. No. 6,408,878 to Unger et al. and U.S. Pat. No. 6,729,352 to O'Conner et al., and/or in a combinatorial synthesis system as described in U.S. Pat. No. 6,508,988 to van Dam et al., each of which is incorporated herein by reference in its entirety.

IV.C. Method of Incorporating a PFPE-Based Microfluidic Device into an Integrated Fluid Flow System.

In some embodiments, the method of performing a chemical reaction or flowing a material within a PFPE-based microfluidic device comprises incorporating the microfluidic device into an integrated fluid flow system. Referring now to FIG. 10, a system for carrying out a method of flowing a material in a microfluidic device and/or a method of performing a chemical reaction in accordance with the presently disclosed subject matter is schematically depicted. The system itself is generally referred to at 1000. System 1000 can comprise a central processing unit 1002, one or more driving force actuators 1010A, 1010B, 1010C, and 1010D, a collector 1020, and a detector 1030. In some embodiments, detector 1030 is in fluid communication with the microfluidic device (shown in shadow). System microfluidic device 1000 of FIG. 8, and these reference numerals of FIG. 8 are employed in FIG. 10. Central processing unit (CPU) 1002 can be, for example, a general purpose personal computer with a related monitor, keyboard or other desired user interface. Driving force actuators 1010A, 1010B, 1010C, and 1010D can be any suitable driving force actuator as would be apparent to one of ordinary skill in the art upon review of the presently disclosed subject matter. For example, driving force actuators 1010A, 1010B, 1010C, and 1010D can be pumps, electrodes, injectors, syringes, or other such devices that can be used to force a material through a microfluidic device. Representative driving forces themselves thus include capillary action, pump driven fluid flow, electrophoresis based fluid flow, pH gradient driven fluid flow, or other gradient driven fluid flow.

In the schematic of FIG. 10 driving force actuator 1010D is shown as connected at outlet aperture 810D, as will be described below, to demonstrate that at least a portion of the driving force can be provided at the end point of the desired flow of solution, reagent, and the like. Collector 1020 is also provided to show that a reaction product 1048, as discussed below, can be collected at the end point of system flow. In some embodiments, collector 1020 comprises a fluid reservoir. In some embodiments, collector 1020 comprises a substrate. In some embodiments, collector 1020 comprises a detector. In some embodiments, collector 1020 comprises a subject in need of therapeutic treatment. For convenience, system flow is generally represented in FIG. 10 by directional arrows F1, F2, and F3.

Continuing with reference to FIG. 10, in some embodiments a chemical reaction is performed in integrated flow system 1000. In some embodiments, material 1040, e.g, a chemical reagent, is introduced to microfluidic device 1000 through aperture 810A, while a second material 1042, e.g., a second chemical reagent, is introduced to microfluidic device 1000, via inlet aperture 810B. Driving force actuators 1010A and 1010B propel chemical reagents 1040 and 1042 to microfluidic channels 831 and 833, respectively. Flow of chemical reagents 1040 and 1042 continues to fluid reservoirs 850A and 850B, where a reserve of reagents 1040 and 1042 is collected. Flow of chemical reagents 1040 and 1042 continues into microfluidic channels 832 and 834 to intersection point 860A wherein initial contact between chemical reagents 1040 and 1042 occurs. Flow of chemical reagents 1040 and 1042 then continues to reaction chamber 870 where a chemical reaction between chemical reagents 1040 and 1042 proceeds.

Continuing with reference to FIG. 10, reaction product 1044 flows to microscale channel 836 and to intersection point 860B. Chemical reagent 1046 then reacts with reaction product 1044 beginning at intersection point 860B through reaction chamber 838 and to fluid reservoir 850C. A second reaction product 1048 is formed. Flow of the second reaction product 1048 continues through microscale channel 840 to aperture 810D and finally into collector 1020. Thus, it is noted that CPU 1002 actuates driving force actuator 1010C such that chemical reagent 1046 is released at an appropriate time to contact reaction product 1044 at intersection point 860B.

IV.D. Rerresentative Applications of a PFPE-Based Microfluidic Device

In some embodiments, the presently disclosed subject matter discloses a method of screening a sample for a characteristic. In some embodiments, the presently disclosed subject matter discloses a method of dispensing a material. In some embodiments, the presently disclosed subject matter discloses a method of separating a material. Accordingly, one of ordinary skill in the art would recognize that the PFPE-based microfluidic device described herein can be applied to many applications, including, but not limited to, genome mapping, rapid separations, sensors, nanoscale reactions, ink-jet printing, drug delivery, Lab-on-a-Chip, in vitro diagnostics, injection nozzles, biological studies, high-throughput screening technologies, such as for use in drug discovery and materials science, diagnostic and therapeutic tools, research tools, and the biochemical monitoring of food and natural resources, such as soil, water, and/or air samples collected with portable or stationary monitoring equipment.

IV.D.1. Method of Screening a Sample for a Characteristic

In some embodiments, the presently disclosed subject matter discloses a method of screening a sample for a characteristic, the method comprising:

(a) providing a microfluidic device comprising a patterned layer of a photocured perfluoropolyether, wherein the patterned layer of the photocured perfluoropolyether comprises a plurality of channels;

(b) providing a target material;

(c) disposing the sample in at least one of the plurality of channels;

(d) contacting the sample with the target material; and (e) detecting an interaction between the sample and the target material, wherein the presence or the absence of the interaction is indicative of the characteristic of the sample.

Referring once again to FIG. 10, at least one of materials 1040 and 1042 comprises a sample. In some embodiments, at least one of materials 1040 and 1042 comprises a target material. Thus, a "sample" generally refers to any material about which information relating to a characteristic is desired. Also, a "target material" can refer to any material which can be used to provide information relating to a characteristic of a sample based on an interaction between the target material and the sample. In some embodiments, for example, when sample 1040 contacts target material 1042 an interaction occurs. In some embodiments, the interaction produces a reaction product 1044. In some embodiments, the interaction comprises a binding event. In some embodiments, the binding event comprises the interaction between, for example, an antibody and an antigen, a substrate and a ligand, or more particularly, a receptor and a ligand, or a catalyst and one or more chemical reagents. In some embodiments, the reaction product is detected by detector 1030.

In some embodiments, the method comprises disposing the target material in at least one of the plurality of channels. Referring once again to FIG. 10, in some embodiments, the target material comprises active material 880. In some embodiments, the target material comprises a substrate, for example non-patterned layer NPL as shown in FIGS. 2A-2D. In some embodiments, the substrate comprises a semiconductor material. Referring now more particularly to FIGS. 2B-2D, in some embodiments, at least one of the plurality of channels of the microfluidic device is in fluid communication with the substrate, e.g., non-patterned layer NPL. In some embodiments, the target material is disposed on a substrate, e.g., non-patterned layer NPL. In some embodiments, at least one of the plurality of channels of the microfluidic device is in fluid communication with the target material disposed on the substrate.

In some embodiments, the method comprises disposing a plurality of samples in at least one of the plurality of channels. In some embodiments, the sample is selected from the group consisting of a therapeutic agent, a diagnostic agent, a research reagent, a catalyst, a metal ligand, a non-biological organic material, an inorganic material, a foodstuff, soil, water, and air. In some embodiments, the sample comprises one or more members of one or more libraries of chemical or biological compounds or components. In some embodiments, the sample comprises one or more of a nucleic acid template, a sequencing reagent, a primer, a primer extension product, a restriction enzyme, a PCR reagent, a PCR reaction product, or a combination thereof. In some embodiments, the sample comprises one or more of an antibody, a cell receptor, an antigen, a receptor ligand, an enzyme, a substrate, an immunochemical, an immunoglobulin, a virus, a virus binding component, a protein, a cellular factor, a growth factor, an inhibitor, or a combination thereof.

In some embodiments, the target material comprises one or more of an antigen, antibody, an enzyme, a restriction enzyme, a dye, a fluorescent dye, a sequencing reagent, a PCR reagent, a primer, a receptor, a ligand, a chemical reagent, or a combination thereof.

In some embodiments, the interaction comprises a binding event. In some embodiments, the detecting of the interaction is performed by at least one or more of a spectrophotometer, a fluorometer, a photodiode, a photomultiplier tube, a microscope, a scintillation counter, a camera, a CCD camera, film, an optical detection system, a temperature sensor, a conductivity meter, a potentiometer, an amperometric meter, a pH meter, or a combination thereof.

Accordingly, after a review of the present disclosure, one of ordinary skill in the art would recognize that the presently disclosed PFPE-based microfluidic device can be used in various screening techniques, such as those described in U.S. Pat. No. 6,749,814 to Berch et al., U.S. Pat. No. 6,737,026 to Bergh et al., U.S. Pat. No. 6,630,353 to Parce et al., U.S. Pat. No. 6,620,625 to Wolk et al., U.S. Pat. No. 6,558,944 to Parce et al., U.S. Pat. No. 6,547,941 to Kopf-Sill et al., U.S. Pat. No. 6,529,835 to Wada et al., U.S. Pat. No. 6,495,369 to Kercso et al., and U.S. Pat. No. 6,150,180 to Parce et al., each of which is incorporated by reference in its entirety. Further, after a review of the present disclosure, one of ordinary skill in the art would recognize that the presently disclosed PFPE-based microfluidic device can be used, for example, to detect DNA, proteins, or other molecules associated with a particular biochemical system, as described in U.S. Pat. No. 6,767,706 to Quake et al., which is incorporated herein by reference in its entirety.

IV.D.2. Method of Dispensing a Material

In some embodiments, the presently disclosed subject matter describes a method of dispensing a material, the method comprising:
  (a) providing a microfluidic device comprising a patterned layer of a photocured perfluoropolyether, wherein the patterned layer of the photocured perfluoropolyether comprises a plurality of channels, and wherein at least one of the plurality of channels comprises an outlet aperture;
  (b) providing at least one material;
  (c) disposing at least one material in at least one of the plurality of channels; and
  (d) dispensing at least one material through the outlet aperture.

Referring once again to FIG. 10, in some embodiments, a material, e.g., material 1040, second material 1042, chemical reagent 1046, reaction product 1044, and/or reaction product 1048 flow through outlet aperture 810D and are dispensed in or on collector 1020.

In some embodiments, the material comprises a drug. In some embodiments, the method comprises metering a predetermined dosage of the drug. In some embodiments, the method comprises dispensing the predetermined dosage of the drug.

In some embodiments, the material comprises an ink composition. In some embodiments, the method comprises dispensing the ink composition on a substrate. In some embodiments, the dispensing of the ink composition on a substrate forms a printed image.

Accordingly, after a review of the present disclosure, one of ordinary skill in the art would recognize that the presently disclosed PFPE-based microfluidic device can be used for microfluidic printing as described in U.S. Pat. No. 6,334,676 to Kaszczuk et al., U.S. Pat. No. 6,128,022 to DeBoer et al., and U.S. Pat. No. 6,091,433 to Wen, each of which is incorporated herein by reference in its entirety.

IV.D.3 Method of Separating a Material

In some embodiments, the presently disclosed subject matter describes a method of separating a material, the method comprising:
  (a) providing a microfluidic device comprising a patterned layer of a photocured perfluoropolyether, wherein the patterned layer of the photocured perfluoropolyether comprises a plurality of channels, and wherein at least one of the plurality of channels comprises a separation region;
  (b) disposing a mixture comprising at least a first material and a second material in the microfluidic device;
  (c) flowing the mixture into at least one of the plurality of channels comprising a separation region; and
  (d) separating the first material from the second material in the separation region to form at least one separated material.

Referring once again to FIG. 10, in some embodiments, at least one of material 1040 and second material 1042 comprise a mixture. For example, material 1040, e.g., a mixture, flows through the microfluidic system to chamber 870, which in some embodiments comprises a separation region. In some embodiments, the separation region comprises active material 880, e.g., a chromatographic material. Material 1040, e.g., a mixture, is separated in chamber 870, e.g., a separation chamber, to form a third material 1044, e.g., a separated material. In some embodiments, separated material 1044 is detected by detector 1030.

In some embodiments, the separation region comprises a chromatographic material. In some embodiments, the chromatographic material is selected from the group consisting of a size-separation matrix, an affinity-separation matrix; and a gel-exclusion matrix, or a combination thereof.

In some embodiments, the first or second material comprises one or more members of one or more libraries of chemical or biological compounds or components. In some embodiments, the first or second material comprises one or more of a nucleic acid template, a sequencing reagent, a primer, a primer extension product, a restriction enzyme, a PCR reagent, a PCR reaction product, or a combination thereof. In some embodiments, the first or second material comprises one or more of an antibody, a cell receptor, an antigen, a receptor ligand, an enzyme, a substrate, an immunochemical, an immunoglobulin, a virus, a virus binding component, a protein, a cellular factor, a growth factor, an inhibitor, or a combination thereof.

In some embodiments, the method comprises detecting the separated material. In some embodiments, the detecting of the separated material is performed by at least one or more of a spectrophotometer, a fluorometer, a photodiode, a photomultiplier tube, a microscope, a scintillation counter, a camera, a CCD camera, film, an optical detection system, a temperature sensor, a conductivity meter, a potentiometer, an amperometric meter, a pH meter, or a combination thereof.

Accordingly, after a review of the present disclosure, one of ordinary skill in the art would recognize that the presently disclosed PFPE-based microfluidic device can be used to separate materials, as described in U.S. Pat. No. 6,752,922 to Huang et al., U.S. Pat. No. 6,274,089 to Chow et al., and U.S. Pat. No. 6,444,461 to Knapp et al., each of which is incorporated herein by reference in its entirety.

V. EXAMPLES

The following Examples have been included to illustrate modes of the presently disclosed subject matter. Certain aspects of the following Examples are described in terms of techniques and procedures found or contemplated to work well in the practice of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

Example 1

Synthesis of Photocured Functionalized PFPE Materials

A representative scheme for the synthesis and photocuring of a functionalized perfluoropolyether is provided in Scheme 1.

Scheme 1. Synthesis and Photocuring of Functionalized Perfluoropolyethers.

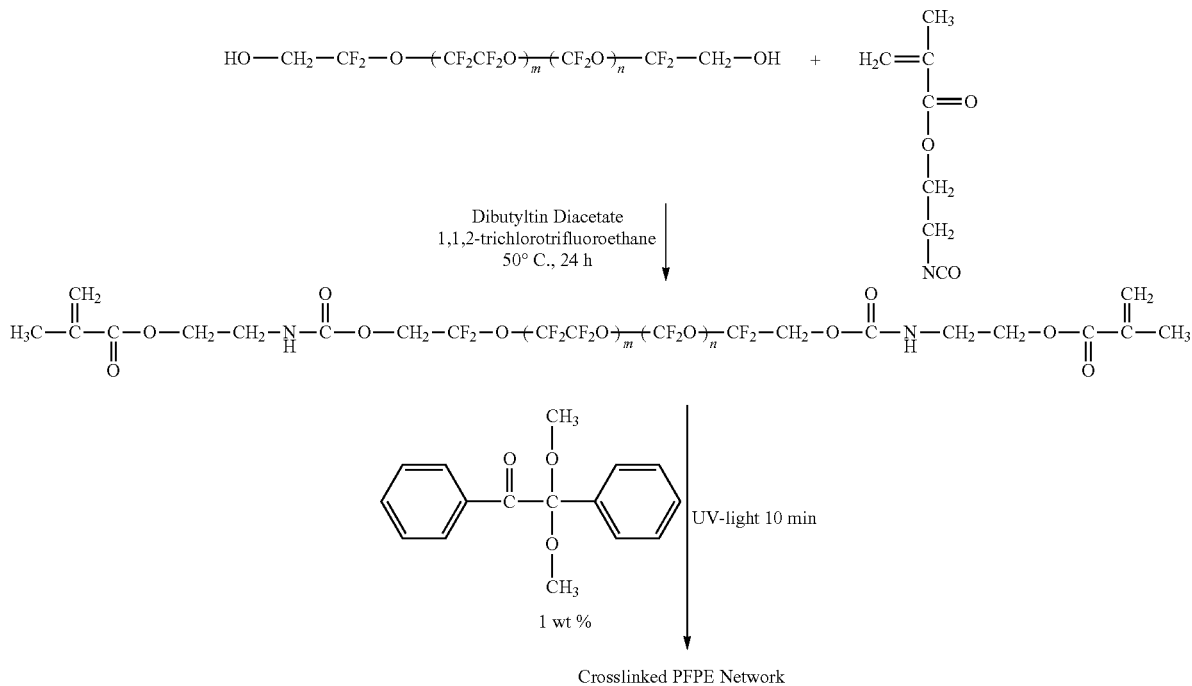

Crosslinked PFPE Network

This method is based on a previously reported procedure. See Priola. A., et al., *Macromol Chem. Phys.* 1997, 198, 1893-1907. The reaction involves the methacrylate functionalization of a commercially available PFPE diol (($M_n$) 3800 g/mol) with isocyanatoethyl methacrylate. Subsequent photocuring of the material is accomplished through blending with 1 wt % of 2,2-dimethoxy-2-phenylacetophenone and exposure to UV radiation ($\lambda$=365 nm).

Example 2

Materials

Poly(tetrafluoroethylene oxide-co-difluoromethylene oxide)a,w diol (ZDOL, Average $M_n$ ca. 3,800 g/mol, 95% Aldrich Chemical Company, Milwaukee, Wis., United States of America), 2-Isocyanatoethyl methacrylate (EIM, 99% Aldrich), 2,2-Dimethoxy-2-phenyl acetophenone (DMPA, 99% Aldrich), Dibutyltin diacetate (DBTDA, 99% Aldrich), and 1,1,2-trichlorotrifluoroethane (Freon 113, 99% Aldrich) were used as received.

Example 3

Preparation of PFPE Dimethacrylate (DMA)

In a typical synthesis, ZDOL (5.7227 g, 1.5 mmol) was added to a dry 50 mL round bottom flask and purged with argon for 15 minutes. EIM (0.43 mL, 3.0 mmol) was then added via syringe along with Freon 113 (2 mL), and DBTDA (50 µL). The solution was immersed in an oil bath and allowed to stir at 50° C. for 24 h. The solution was then passed through a chromatographic column (alumina, Freon 113, 2 cm=5 cm). Evaporation of the solvent yielded a clear, colorless, viscous oil, which was further purified by passage through a 0.22-µm polyethersulfone filter. 1H-NMR (ppm): 2.1, s (3H); 3.7, q (2H); 4.4, t (2H); 4.7, t (2H); 5.3, m (1H); 5.8, s (1H); 6.3, s (1H).

Example 4

Photocuring of PFPE DMA

In a typical cure, 1 wt % of DMPA (0.05 g, 2.0 mmol) was added to PFPE DMA (5 g, 1.2 mmol) along with 2 mL Freon 113 until a clear solution was formed. After removal of the solvent, the cloudy viscous oil was passed through a 0.22-µm polyethersulfone filter to remove any DMPA that did not disperse into the PFPE DMA. The filtered PFPE DMA was then irradiated with a UV source (Electro-lite UV curing chamber model no. 81432-ELC-500, Danbury, Conn., United States of America, $\lambda$=365 nm) while under a nitrogen purge for 10 min, yielding a clear, slightly yellow, rubbery material.

Example 5

Device Fabrication with PFPE DMA

In a typical fabrication, PFPE DMA containing photoinitiator (as described in Example 4) was spin coated to a thickness of 20 µm (800 rpm) onto a Si wafer containing the desired photoresist pattern. This wafer was then placed into the UV curing chamber and irradiated for 6 s. Separately, a thick layer (~5 mm) of the material was produced by pouring the PFPE DMA containing photoinitiator into a mold surrounding the Si wafer containing the desired photoresist pattern. This wafer was irradiated with UV light for 1 min. Following this step, the thick layer was removed and inlet holes were carefully punched in specific areas of the device. The thick layer was then carefully placed on top of the thin layer such that the patterns in the two layers were precisely aligned, and then the entire device was irradiated for 10 min. Once complete, the entire device was peeled from the wafer with both layers adhered together. These curing times were determined to be the optimal exposure times to achieve a good balance between structure failure and proper adhesion of the two layers.

Example 6

Swelling Experiments

Swelling experiments were performed by soaking fully cured PFPE DMA and fully cured Sylgard® 184 (Dow Corning, Midland, Mich., United States of America) in dichloromethane. The % Swelling was determined using the following equation:

$$\% \text{ Swelling} = 100\% * (W_t - W_0)/W_0$$

where $W_t$ is the weight of the material immediately after soaking in dichloromethane for time t and being patted dry with a paper tissue, and $W_0$ is the original weight of the material.

Example 7

Rheometry

Figure 11:
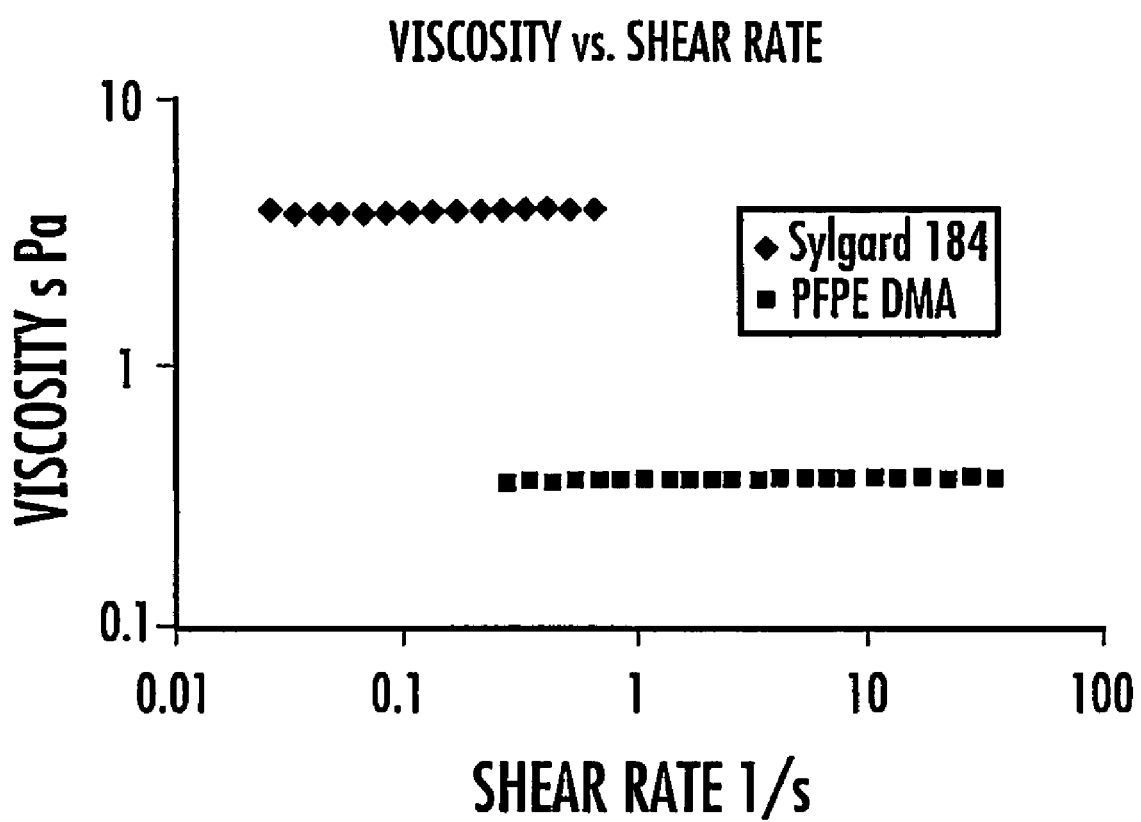
FIG. 11 is a plot of the viscosity versus the shear rate for Sylgard® 184 and perfluoropolyether dimethacrylate (PFPE DMA) materials.

Viscosities of the two elastomer precursors (PFPE DMA and Sylgard® 184) were measured on a TA Instruments AR2000 Rheometer (New Castle, Del., United States of America). Measurements were taken on approximately 3-5 mL of material. Measurements on the Sylgard® 184 precursors were taken immediately after mixing the two components. The shear rate for Sylgard® 184 was varied from 0.03 $s^{-1}$ to 0.70 $s^{-1}$ and resulted in a constant viscosity at each shear rate. The shear rate for PFPE DMA was varied from 0.28 $s^{-1}$ to 34.74 $s^{-1}$ and also resulted in a constant viscosity regardless of the shear rate. Viscosities were obtained by taking an average of the viscosity values over all measured shear rates on a logarithmic plot. The raw data for these experiments are shown in FIG. 11.

Example 8

Dynamic Mechanical Analysis (DMA)

Modulus measurements were taken on a PerkinElmer DMA 7e Dynamic Mechanical Analyzer (Boston, Mass., United States of America). Samples were cut into 4-mm×8-mm×0.5-mm (width×length×thickness) rectangles. The initial static force on each of the two samples was 5 mN and the load was increased at rate of 500 mN/min until the sample ruptured or it reached 6400 mN. The tensile moduli were obtained from the initial slope (up to approximately 20% strain) of the stress/strain curves.

Example 9

Dynamic Mechanical Thermal Analysis

Thermal transitions of the two elastomers were obtained on a Seiko DMS 210 Dynamic Mechanical Thermal Analyzer (Seiko Instruments, Inc., Chiba, Japan). Samples were cut into 4-mm×20-mm×0.5-mm (width×length×thickness) rectangles. The following settings were used: Lamp=10, Min Tension/Compression force=10.000 g, Tension/Compression correction=1.2; Force amplitude=100. The temperature sweep ranged from −140° C. to 50° C. Tg's were obtained from the corresponding temperature at the maxima in a plot of E" (loss modulus) vs. temperature.

Example 10

Contact Angle Measurements

Static contact angles were measured using a KSV Instruments CAM 200 Optical Contact Angle Meter (KSV Instruments, Ltd., Helsinki, Finland). Droplets were placed on each of the fully cured elastomers using a 250-µL screw-top syringe.

Example 11

Results

To measure solvent resistance, tests using classical swelling measurements were performed on both the cross-linked PFPE DMA and Sylgard® 184, a PDMS. Rubinstein, M., et al., *Polymer Physics*; Oxford University Press: New York, 2003; p 398. Sample weight was compared before and after immersion in dichloromethane for several hours. The data show that after 94 h the PDMS network had swelled to 109% by weight, while the PFPE network showed negligible swelling (<3%).

The PDMS and PFPE precursor materials and the fully cured networks have similar processing and mechanical properties. Rheology experiments showed the viscosity of the uncured PFPE DMA at 25° C. to be 0.36 Pa·s, which is significantly lower than that of 3.74 Pa·s for the uncured Sylgard® 184. Because both materials are viscous oils at room temperature, however, standard PDMS device fabrication methods also could be used with the PFPE materials.

Said another way, the PFPE materials of the presently disclosed subject matter exhibit low viscosities and are pourable. These properties distinguish PFPE materials from other fluoroelastomers, such as Kalrez® (DuPont Dow Elastomers, L.L.C., Wilmington, Del., United States of America) and Viton® (DuPont Dow Elastomers, L.L.C., Wilmington, Del., United States of America), which have high viscosities. For example, the viscosity of Viton® is 7800 Pa·s at 160° C. Further, Kalrez® and Viton® are each cured thermally only.

Figure 12:
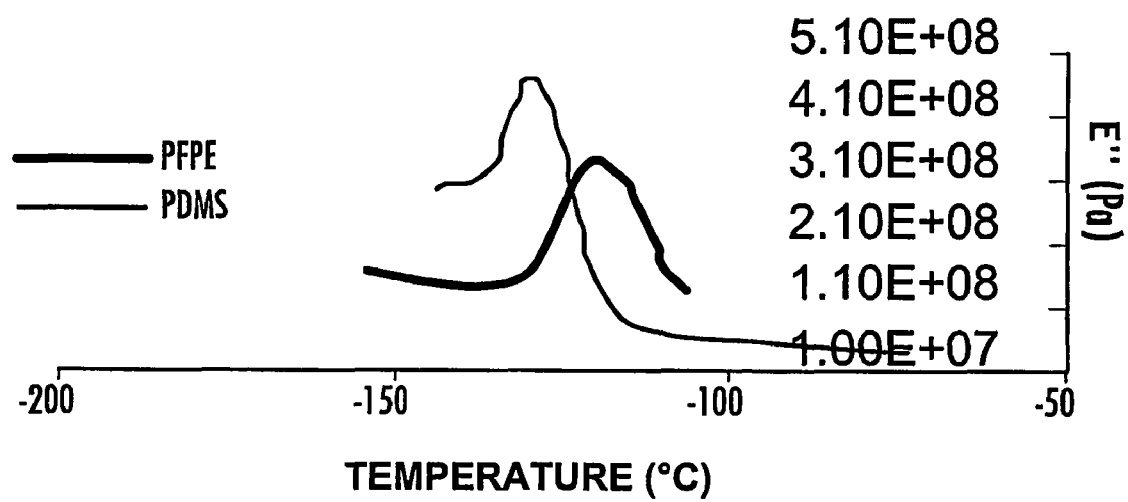
FIG. 12 represents the dynamic mechanical thermal analysis (DMTA) traces of crosslinked polydimethylsiloxane (PDMS) and perfluoropolyether (PFPE) materials showing maxima in the loss modulus as a function of temperature.

Dynamic mechanical thermal analysis (DMTA) was performed on the fully cured materials. Both the PFPE and PDMS networks exhibited low temperature transitions (−112° C. and −128° C., respectively) as evidenced by maxima in the loss modulus E" (see FIG. 12). This transition accounts for the similar elastic behavior of the two crosslinked materials at room temperature. Stress strain analysis shows that the tensile modulus of the fully cured PFPE-based elastomer is 3.9 MPa, which similar to that measured for fully cured Sylgard® 184 (2.4 MPa). Static contact angle measurements were made on both the elastomers.

As provided in Table IV, the PFPE DMA elastomer showed a higher contact angle than Sylgard® 184 for water and methanol. Toluene and dichloromethane instantly swelled Sylgard® 184 on contact, which prevented measurements to be taken. Contact angle values for these solvents were obtained for the PFPE DMA material, however, as no swelling occurred.

TABLE IV

| Elastomer | Static Contact Angles (deg)[a] | | | |
|---|---|---|---|---|
|  | Water | Methanol | Toluene | Dichloromethane |
| PFPE DMA | 107 | 35 | 40 | 43 |
| Sylgard ® 184 | 101 | 22 | — | — |

[a] (—) indicates that the solvent swelled the material and no accurate measurement could be taken.

Figure 13A:
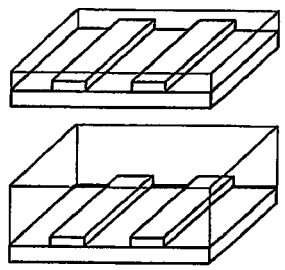
FIGS. 13A-13C depict a representative device fabrication procedure.
Figure 13B:
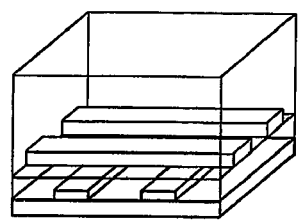
Figure 13C:
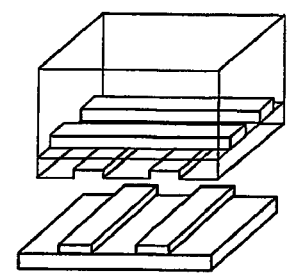

In some embodiments, device fabrication was accomplished according to the procedure illustrated in FIG. 13. This procedure uses partial curing techniques to adhere the two layers without compromising feature sizes. Unger, M. A., et al., *Science* 2000, 288, 113-116. The PFPE DMA material was spin-coated and molded using procedures designed for Sylgard® 184.

Figure 14:
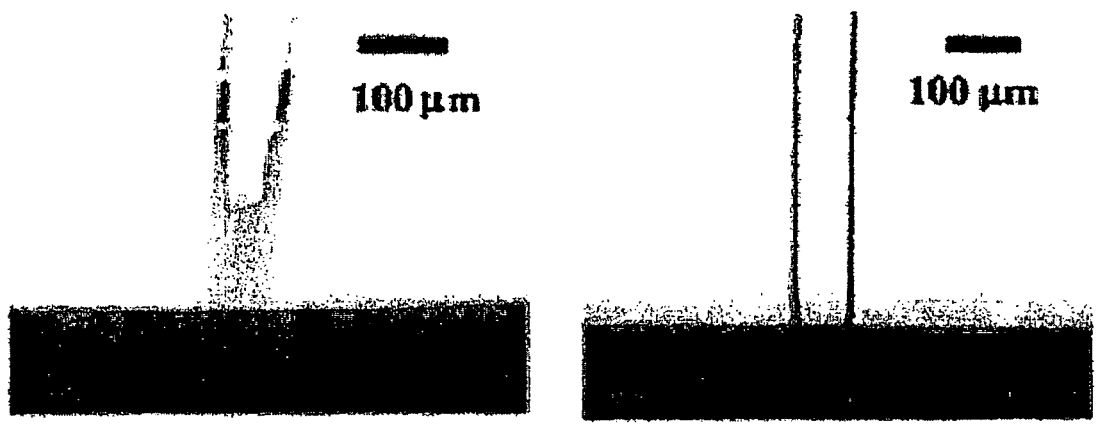
FIG. 14 depicts a photograph of a dyed solution of dichloromethane, acetonitrile, and methanol entering a PFPE device channel (left). In comparison, no solution entered a PDMS channel of the same size due to swelling (right).

To compare the solvent compatibility of devices made from the two materials, a dyed solution containing dichloromethane, acetonitrile, and methanol was introduced into a PFPE channel and a PDMS channel by capillary action (see FIG. 14). The PFPE channels showed no evidence of swelling as the solution traveled easily through the channel. A pronounced reverse meniscus was observed, indicating good wetting behavior. In contrast, no solution entered the PDMS device because the channel was plugged shut when it made contact with the droplet. As a control, a dyed methanol solution was easily introduced in the PDMS channel in the same manner. Actuation of the valves was accomplished by introducing pressurized air (~25 psi) to small holes that were punched through the thick layer at the beginning of the channels. When the solution was present in the channel, valve actuation was observed (see FIG. 15).

It will be understood that various details of the presently disclosed subject matter can be changed without departing from the scope of the presently disclosed subject matter. Furthermore, the foregoing description is for the purpose of illustration only, and not for the purpose of limitation.

What is claimed is:

1. A method of forming a patterned layer of a photocured perfluoropolyether, the method comprising:
   (a) providing a substrate, wherein the substrate comprises a patterned surface;
   (b) contacting a perfluoropolyether precursor with the patterned surface of the substrate; and
   (c) photocuring the perfluoropolyether precursor to form a patterned layer of a photocured perfluoropolyether.

2. The method of claim 1, comprising:
   (a) coating the patterned surface of the substrate with a blend of a perfluoropolyether precursor and a photoinitiator to form a coated, patterned substrate;
   (b) exposing the coated, patterned substrate to ultraviolet radiation for a period of time to form a layer of a photocured perfluoropolyether on the patterned substrate; and
   (c) removing the layer of the photocured perfluoropolyether from the patterned substrate to produce a patterned layer of the photocured perfluoropolyether.

3. The method of claim 2, wherein the perfluoropolyether precursor comprises an end functionalized perfluoropolyether.

4. The method of claim 2, wherein the photoinitiator comprises 2,2-dimethoxy-2-phenyl acetophenone.

5. The method of claim 2, wherein the photocured perfluoropolyether comprises a perfluoropolyether dimethacrylate.

6. The method of claim 2, wherein the photocured perfluoropolyether comprises a perfluoropolyether distyrenic.

7. The method of claim 2, wherein the patterned substrate comprises an etched silicon wafer.

8. The method of claim 2, wherein the patterned substrate comprises a photoresist patterned substrate.

9. The method of claim 2, wherein the coating step comprises a spin-coating step.

10. The method of claim 2, wherein the ultraviolet radiation has a wavelength of about 365 nanometers.

11. The method of claim 2, wherein the period of time of the ultraviolet radiation ranges from about one second to about 300 seconds.

12. The method of claim 11, wherein the period of time of the ultraviolet radiation ranges from about one second to about 100 seconds.

13. The method of claim 12, wherein the period of time of the ultraviolet radiation is about 60 seconds.

14. The method of claim 12, wherein the period of time of the ultraviolet radiation is about 6 seconds.

15. The method of claim 2, wherein the patterned layer of the photocured perfluoropolyether is between about 1 micrometers and about 100 micrometers thick.

16. The method of claim 15, wherein the patterned layer of the photocured perfluoropolyether is between about 1 micrometer and about 50 micrometers thick.

17. The method of claim 16, wherein the patterned layer of the photocured perfluoropolyether is about 20 micrometers thick.

18. The method of claim 2, wherein the patterned layer of the photocured perfluoropolyether is between about 0.1 millimeters and about 10 millimeters thick.

19. The method of claim 18, wherein the patterned layer of the photocured perfluoropolyether is about 5 millimeters thick.

20. The method of claim 2, comprising:
   (a) overlaying a first patterned layer of the photocured perfluoropolyether on a second patterned layer of the photocured perfluoropolyether, wherein the patterns of the first and second layers of the photocured perfluoropolyether are aligned in a predetermined alignment; and
   (b) exposing the first and the second layers of the photocured perfluoropolyether to ultraviolet radiation for a period of time.

21. The method of claim 20, wherein the first and the second patterned layers of the photocured perfluoropolyether adhere to one another.

22. The method of claim 20, wherein the first patterned layer of the photocured perfluoropolyether is about 5 millimeters thick.

23. The method of claim 20, wherein the second patterned layer of the photocured perfluoropolyether is about 20 micrometers thick.

24. The method of claim 20, wherein the predetermined alignment of the first and second layers of the photocured perfluoropolyether forms a plurality of microscale channels.

25. The method of claim 24, wherein the plurality of microscale channels comprises an integrated network of microscale channels.

26. The method of claim 25, wherein the microscale channels of the integrated network intersect at predetermined points.

27. The method of claim 20, comprising forming a plurality of holes in the first patterned layer of the photocured perfluoropolyether.

28. The method of claim 27, comprising at least one pressure actuated valve, wherein the pressure actuated valve is defined by one of:

(a) a microscale channel; and
(b) at least one of the plurality of holes.

29. The method of claim 1, wherein the patterned layer of the photocured perfluoropolyether comprises a plurality of microscale channels.

30. The method of claim 29, wherein the plurality of microscale channels comprises an integrated network of microscale channels.

31. The method of claim 30, wherein the microscale channels of the integrated network intersect at predetermined points.

32. The method of claim 1, comprising forming a plurality of holes in the patterned layer of the photocured perfluoropolyether.

33. The method of claim 32, wherein at least one of the plurality of holes comprises an inlet aperture.

34. The method of claim 32, wherein at least one of the plurality of holes comprises an outlet aperture.

35. The method of claim 32, comprising at least one pressure actuated valve, wherein the pressure actuated valve is defined by one of:
(a) a microscale channel; and
(b) at least one of the plurality of holes.

36. A microfluidic device comprising a patterned layer of a photocured perfluoropolyether.

37. The microfluidic device of claim 36, wherein the photocured perfluoropolyether is selected from one of a perfluoropolyether dimethacrylate and a perfluoropolyether distyrenic, or a combination thereof.

38. The microfluidic device of claim 36, wherein the patterned layer of the photocured perfluoropolyether is between about 1 micrometers and about 100 micrometers thick.

39. The microfluidic device of claim 38, wherein the patterned layer of the photocured perfluoropolyether is about 20 micrometers thick.

40. The microfluidic device of claim 36, wherein the patterned layer of the photocured perfluoropolyether is between about 0.1 millimeters and about 10 millimeters thick.

41. The microfluidic device of claim 40, wherein the patterned layer of the photocured perfluoropolyether is about 5 millimeters thick.

42. The microfluidic device of claim 36, wherein the patterned layer of the photocured perfluoropolyether comprises a plurality of microscale channels.

43. The microfluidic device of claim 42, wherein the plurality of microscale channels comprises an integrated network of microscale channels.

44. The microfluidic device of claim 43, wherein the microscale channels of the integrated network intersect at predetermined points.

45. The microfluidic device of claim 36, wherein the patterned layer of the photocured perfluoropolyether comprises a plurality of holes.

46. The microfluidic device of claim 45, wherein at least one of the plurality of holes comprises an inlet aperture.

47. The microfluidic device of claim 45, wherein at least one of the plurality of holes comprises an outlet aperture.

48. The microfluidic device of claim 45, comprising at least one pressure actuated valve, wherein the pressure actuated valve is defined by one of:
(a) a microscale channel; and
(b) at least one of the plurality of holes.

49. A microfluidic device comprising a first patterned layer of a photocured perfluoropolyether and a second patterned layer of a photocured perfluoropolyether, wherein (a) the first patterned layer of the photocured perfluoropolyether is overlaid on the second patterned layer of the photocured perfluoropolyether; and
(b) the patterns of the first and second layers of the photocured perfluoropolyether are aligned in a predetermined alignment.

50. The microfluidic device of claim 49, wherein the first and the second patterned layers of the photocured perfluoropolyether adhere to one another.

51. The microfluidic device of claim 49, wherein the first patterned layer of the photocured perfluoropolyether is about 5 millimeters thick.

52. The microfluidic device of claim 49, wherein the second patterned layer of the photocured perfluoropolyether is about 20 micrometers thick.

53. The microfluidic device of claim 49, wherein the predetermined alignment of the first and second layers of the photocured perfluoropolyether forms a plurality of microscale channels.

54. The microfluidic device of claim 53, wherein the plurality of microscale channels comprises an integrated network of microscale channels.

55. The microfluidic device of claim 54, wherein the microscale channels of the integrated network intersect at predetermined points.

56. The microfluidic device of claim 49, wherein at least one of the patterned layers of the photocured perfluoropolyether comprises a plurality of holes.

57. The microfluidic device of claim 56, wherein at least one of the plurality of holes comprises an inlet aperture.

58. The microfluidic device of claim 56, wherein at least one of the plurality of holes comprises an outlet aperture.

59. The microfluidic device of claim 56, comprising at least one pressure actuated valve, wherein the pressure actuated valve is defined by one of:
(a) a microscale channel; and
(b) at least one of the plurality of holes.

60. A microfluidic device comprising a patterned layer of a photocured perfluoropolyether, wherein the patterned layer of the photocured perfluoropolyether comprises a solvent disposed therein.

61. The microfluidic device of claim 60, wherein the patterned layer of the photocured perfluoropolyether comprises a plurality of microscale channels, and wherein the solvent is disposed in one or more of the channels.

62. The microfluidic device of claim 61, wherein at least one of the microscale channels comprises a fluid reservoir, and wherein the solvent is disposed in the fluid reservoir.

63. The microfluidic device of claim 61, wherein the plurality of microscale channels comprises an integrated network of microscale channels.

64. The microfluidic device of claim 63, wherein the microscale channels of the integrated network intersect at predetermined points.

65. The microfluidic device of claim 60, wherein the patterned layer of the photocured perfluoropolyether comprises a plurality of holes.

66. The microfluidic device of claim 65, wherein at least one of the plurality of holes comprises an inlet aperture.

67. The microfluidic device of claim 65, wherein at least one of the plurality of holes comprises an outlet aperture.

68. The microfluidic device of claim 65, comprising at least one pressure actuated valve, wherein the pressure actuated valve is defined by one of:
(a) a microscale channel; and
(b) at least one of the plurality of holes.

69. The microfluidic device of claim 65, wherein one or more of the plurality of holes is reversibly sealed.

70. The microfluidic device of claim 60, wherein the solvent comprises an organic solvent.

71. A microfluidic device comprising a patterned layer of a photocured perfluoropolyether, wherein the patterned layer of the photocured perfluoropolyether comprises one or more chemical reactants disposed therein.

72. The microfluidic device of claim 71, wherein the patterned layer of the photocured perfluoropolyether comprises a plurality of microscale channels, and wherein the one or more chemical reactants is disposed in one or more of the channels.

73. The microfluidic device of claim 72, wherein at least one of the microscale channels comprises a fluid reservoir, and wherein the one or more chemical reactants is disposed in the fluid reservoir.

74. The microfluidic device of claim 73, wherein at least one of the microscale channels comprises a reaction chamber in fluid communication with the fluid reservoir, and wherein the one or more chemical reactants is disposed in the reaction chamber.

75. The microfluidic device of claim 72, wherein the plurality of microscale channels comprises an integrated network of microscale channels.

76. The microfluidic device of claim 75, wherein the microscale channels of the integrated network intersect at predetermined points.

77. The microfluidic device of claim 71, wherein the patterned layer of the photocured perfluoropolyether comprises a plurality of holes.

78. The microfluidic device of claim 77, wherein at least one of the plurality of holes comprises an inlet aperture.

79. The microfluidic device of claim 77, wherein at least one of the plurality of holes comprises an outlet aperture.

80. The microfluidic device of claim 77, comprising at least one pressure actuated valve, wherein the pressure actuated valve is defined by one of:
(a) a microscale channel; and
(b) at least one of the plurality of holes.

81. The microfluidic device of claim 77, wherein one or more of the plurality of holes is reversibly sealed.

82. A microfluidic device comprising a patterned layer of a photocured perfluoropolyether, wherein the patterned layer of the photocured perfluoropolyether comprises one or more reaction products disposed therein.

83. The microfluidic device of claim 82, wherein the patterned layer of the photocured perfluoropolyether comprises a plurality of microscale channels, and wherein the one or more reaction products is disposed in one or more of the channels.

84. The microfluidic device of claim 83, wherein at least one of the microscale channels comprises a reaction chamber, and wherein the one or more reaction products is disposed in the reaction chamber.

85. The microfluidic device of claim 84, wherein at least one of the microscale channels comprises a fluid reservoir in fluid communication with the reaction chamber, and wherein the one or more reaction products is disposed in the reaction chamber.

86. The microfluidic device of claim 83, wherein the plurality of microscale channels comprises an integrated network of microscale channels.

87. The microfluidic device of claim 86, wherein the microscale channels of the integrated network intersect at predetermined points.

88. The microfluidic device of claim 82, wherein the patterned layer of the photocured perfluoropolyether comprises a plurality of holes.

89. The microfluidic device of claim 88, wherein at least one of the plurality of holes comprises an inlet aperture.

90. The microfluidic device of claim 88, wherein at least one of the plurality of holes comprises an outlet aperture.

91. The microfluidic device of claim 88, comprising at least one pressure actuated valve, wherein the pressure actuated valve is defined by one of:
(a) a microscale channel; and
(b) at least one of the plurality of holes.

92. The microfluidic device of claim 88, wherein one or more of the plurality of holes is reversibly sealed.

93. A microfluidic device comprising a patterned layer of a photocured perfluoropolyether, wherein the patterned layer of the photocured perfluoropolyether comprises one or more chemical reactants and one or more reaction products disposed therein.

94. The microfluidic device of claim 93, wherein the patterned layer of the photocured perfluoropolyether comprises a plurality of microscale channels, and wherein the one or more chemical reactants and the one or more reaction products are disposed in one or more of the channels.

95. The microfluidic device of claim 94, wherein at least one of the microscale channels comprises a first fluid reservoir, and wherein the one or more chemical reactants is disposed in the first fluid reservoir.

96. The microfluidic device of claim 95, wherein at least one of the microscale channels comprises a reaction chamber in fluid communication with the fluid reservoir, and wherein the one or more chemical reactants and the one or more reaction products are disposed in the reaction chamber.

97. The microfluidic device of claim 96, wherein at least one of the microscale channels comprises a second fluid reservoir in fluid communication with the reaction chamber, and wherein the one or more reaction products is disposed in the second fluid reservoir.

98. The microfluidic device of claim 94, wherein the plurality of microscale channels comprises an integrated network of microscale channels.

99. The microfluidic device of claim 98, wherein the microscale channels of the integrated network intersect at predetermined points.

100. The microfluidic device of claim 94, wherein the patterned layer of the photocured perfluoropolyether comprises a plurality of holes.

101. The microfluidic device of claim 100, wherein at least one of the plurality of holes comprises an inlet aperture.

102. The microfluidic device of claim 100, wherein at least one of the plurality of holes comprises an outlet aperture.

103. The microfluidic device of claim 100, comprising at least one pressure actuated valve, wherein the pressure actuated valve is defined by one of:
(a) a microscale channel; and
(b) at least one of the plurality of holes.

104. The microfluidic device of claim 100, wherein one or more of the plurality of holes is reversibly sealed.

105. A method of flowing a material in a microfluidic device, the method comprising:
(a) providing a microfluidic device comprising at least one patterned layer of a photocured perfluoropolyether, wherein the patterned layer of the photocured perfluoropolyether comprises at least one microscale channel; and
(b) flowing a material in the microscale channel.

106. The method of claim 105, comprising disposing a material in the microfluidic device.

107. The method of claim 105, comprising applying a driving force to move the material along the microscale channel.

108. The method of claim 105, further comprising a plurality of microscale channels.

109. The method of claim 108, wherein the plurality of microscale channels comprises an integrated network of microscale channels.

110. The method of claim 109, wherein the microscale channels of the integrated network intersect predetermined points.

111. The method of claim 105, wherein the patterned layer of the photocured perfluoropolyether comprises a plurality of holes.

112. The method of claim 111, wherein at least one of the plurality of holes comprises an inlet aperture.

113. The method of claim 111, wherein at least one of the plurality of holes comprises an outlet aperture.

114. The method of claim 111, comprising at least one pressure actuated valve, wherein the pressure actuated valve is defined by one of:
(a) a microscale channel; and
(b) at least one of the plurality of holes.

115. The method of claim 114, wherein the pressure actuated valve is actuated by introducing a pressurized fluid into one of:
(a) a microscale channel; and
(b) at least one of the plurality of holes.

116. The method of claim 115, wherein the pressurized fluid has a pressure between about 10 psi and about 40 psi.

117. The method of claim 116, wherein the pressure is about 25 psi.

118. The method of claim 105, wherein the material comprises a fluid.

119. The method of claim 118, wherein the fluid comprises a solvent.

120. The method of claim 119, wherein the solvent comprises an organic solvent.

121. The method of claim 105, wherein the material flows in a predetermined direction along the microscale channel.

122. A method of performing at least one chemical reaction, the method comprising:
(a) providing a microfluidic device comprising a patterned layer of a photocured perfluoropolyether; and
(b) contacting a first reagent and a second reagent in the microfluidic device to form at least one reaction product.

123. The method of claim 122, wherein the patterned layer of the photocured perfluoropolyether comprises a plurality of microscale channels.

124. The method of claim 123, wherein at least one of the microscale channels comprises a fluid reservoir.

125. The method of claim 124, wherein at least one of the microscale channels comprises a fluid reaction chamber in fluid communication with the fluid reservoir.

126. The method of claim 123, wherein the plurality of microscale channels comprises an integrated network of microscale channels.

127. The method of claim 126, wherein the microscale channels of the integrated network intersect at predetermined points.

128. The method of claim 122, wherein the first reagent and the second reagent are disposed in separate channels of the microfluidic device.

129. The method of claim 122, comprising flowing the first reagent and the second reagent in a predetermined direction in the microfluidic device.

130. The method of claim 122, wherein the contacting of the first reagent and the second reagent is performed in a microscale reaction chamber.

131. The method of claim 122, comprising flowing the reaction product in a predetermined direction in the microfluidic device.

132. The method of claim 122, comprising recovering the reaction product.

133. The method of claim 132, comprising flowing the reaction product to an outlet aperture of the microfluidic device.

134. The method of claim 122, comprising contacting the reaction product with a third reagent to form a second reaction product.

135. The method of claim 122, wherein the first reagent and the second reagent comprise an organic solvent.

136. The method of claim 122, wherein the chemical reaction comprises a nanoscale chemical reaction.

137. A reaction product formed by the method of claim 122.

138. The method of claim 122, wherein the first reagent and the second reagent are independently selected from one of a nucleotide and a polynucleotide.

139. The method of claim 138, wherein the reaction product comprises a polynucleotide.

140. The method of claim 139, wherein the polynucleotide is DNA.

141. A reaction product formed by the method of claim 138.

142. A method of screening a sample for a characteristic, the method comprising:
(a) providing a microfluidic device comprising a patterned layer of a photocured perfluoropolyether, wherein the patterned layer of the photocured perfluoropolyether comprises a plurality of channels;
(b) providing a target material;
(c) disposing the sample in at least one of the plurality of channels;
(d) contacting the sample with the target material; and
(e) detecting an interaction between the sample and the target material, wherein the presence or the absence of the interaction is indicative of the characteristic of the sample.

143. The method of claim 142, comprising disposing the target material in at least one of the plurality of channels.

144. The method of claim 142, wherein the target material comprises a substrate.

145. The method of claim 144, wherein at least one of the plurality of channels of the microfluidic device is in fluid communication with the substrate.

146. The method of claim 142, wherein the target material is disposed on a substrate.

147. The method of claim 146, wherein at least one of the plurality of channels of the microfluidic device is in fluid communication with the target material disposed on the substrate.

148. The method of claim 142, comprising disposing a plurality of samples in at least one of the plurality of channels.

149. The method of claim 142, wherein the sample is selected from the group consisting of a therapeutic agent, a diagnostic agent, a research reagent, a catalyst, a metal ligand, a non-biological organic material, an inorganic material, a foodstuff, soil, water, and air.

150. The method of claim 142, wherein the sample comprises one or more members of one or more libraries of chemical or biological compounds or components.

151. The method of claim 142, wherein the sample comprises one or more of a nucleic acid template, a sequencing reagent, a primer, a primer extension product, a restriction enzyme, a PCR reagent, a PCR reaction product, or a combination thereof.

152. The method of claim 142, wherein the sample comprises one or more of an antibody, a cell receptor, an antigen, a receptor ligand, an enzyme, a substrate, an immunochemical, an immunoglobulin, a virus, a virus binding component, a protein, a cellular factor, a growth factor, an inhibitor, or a combination thereof.

153. The method of claim 142, wherein the target material comprises one or more of an antigen, antibody, an enzyme, a restriction enzyme, a dye, a fluorescent dye, a sequencing reagent, a PCR reagent, a primer, a receptor, a ligand, a chemical reagent, or a combination thereof.

154. The method of claim 142, wherein the interaction comprises a binding event.

155. The method of claim 142, wherein the detecting of the interaction is performed by at least one or more of a spectrophotometer, a fluorometer, a photodiode, a photomultiplier tube, a microscope, a scintillation counter, a camera, a CCD camera, film, an optical detection system, a temperature sensor, a conductivity meter, a potentiometer, an amperometric meter, a pH meter, or a combination thereof.

156. A method of dispensing a material, the method comprising:
(a) providing a microfluidic device comprising a patterned layer of a photocured perfluoropolyether, wherein the patterned layer of the photocured perfluoropolyether comprises a plurality of channels, and wherein at least one of the plurality of channels comprises an outlet aperture;
(b) providing at least one material;
(c) disposing at least one material in at least one of the plurality of channels; and
(d) dispensing at least one material through the outlet aperture.

157. The method of claim 156, wherein the material comprises a drug.

158. The method of claim 157, comprising metering a predetermined dosage of the drug.

159. The method of claim 158, comprising dispensing the predetermined dosage of the drug.

160. The method of claim 156, wherein the material comprises an ink composition.

161. The method of claim 160, comprising dispensing the ink composition on a substrate.

162. The method of claim 161, wherein the dispensing of the ink composition on a substrate forms a printed image.

163. A method of separating a material, the method comprising:
(a) providing a microfluidic device comprising a patterned layer of a photocured perfluoropolyether, wherein the patterned layer of the photocured perfluoropolyether comprises a plurality of channels, and wherein at least one of the plurality of channels comprises a separation region;
(b) disposing a mixture comprising at least a first material and a second material in the microfluidic device;
(c) flowing the mixture into at least one of the plurality of channels comprising a separation region; and
(d) separating the first material from the second material in the separation region to form at least one separated material.

164. The method of claim 163, wherein the separation region comprises a chromatographic material.

165. The method of claim 164, wherein the chromatographic material is selected from the group consisting of a size-separation matrix, an affinity-separation matrix; and
a gel-exclusion matrix, or a combination thereof.

166. The method of claim 163, wherein the first or second material comprises one or more members of one or more libraries of chemical or biological compounds or components.

167. The method of claim 163, wherein the first or second material comprises one or more of a nucleic acid template, a sequencing reagent, a primer, a primer extension product, a restriction enzyme, a PCR reagent, a PCR reaction product, or a combination thereof.

168. The method of claim 163, wherein the first or second material comprises one or more of an antibody, a cell receptor, an antigen, a receptor ligand, an enzyme, a substrate, an immunochemical, an immunoglobulin, a virus, a virus binding component, a protein, a cellular factor, a growth factor, an inhibitor, or a combination thereof.

169. The method of claim 163, comprising detecting the separated material.

170. The method of claim 169, wherein the detecting of the separated material is performed by at least one or more of a spectrophotometer, a fluorometer, a photodiode, a photomultiplier tube, a microscope, a scintillation counter, a camera, a CCD camera, film, an optical detection system, a temperature sensor, a conductivity meter, a potentiometer, an amperometric meter, a pH meter, or a combination thereof.

* * * * *